(12) United States Patent
Wang et al.

(10) Patent No.: US 12,266,688 B2
(45) Date of Patent: *Apr. 1, 2025

(54) SEMICONDUCTOR DEVICE WITH SOURCE/DRAIN CONTACT FORMED USING BOTTOM-UP DEPOSITION

(71) Applicant: TAIWAN SEMICONDUCTOR MANUFACTURING CO., LTD., Hsinchu (TW)

(72) Inventors: Sung-Li Wang, Hsinchu County (TW); Mrunal A. Khaderbad, Hsinchu (TW); Yasutoshi Okuno, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/331,917

(22) Filed: Jun. 8, 2023

(65) Prior Publication Data

US 2023/0335592 A1 Oct. 19, 2023

Related U.S. Application Data

(60) Continuation of application No. 17/107,471, filed on Nov. 30, 2020, now Pat. No. 11,715,763, which is a (Continued)

(51) Int. Cl.
*H01L 29/08* (2006.01)
*H01L 21/02* (2006.01)
(Continued)

(52) U.S. Cl.
CPC ...... *H01L 29/0847* (2013.01); *H01L 21/0262* (2013.01); *H01L 21/28518* (2013.01);
(Continued)

(58) Field of Classification Search
CPC ............ H01L 29/0847; H01L 21/0262; H01L 21/28518; H01L 21/76224; H01L 21/76802; H01L 21/76876; H01L 21/76883; H01L 21/76897; H01L 21/823814; H01L 21/823821;
(Continued)

(56) References Cited

U.S. PATENT DOCUMENTS

| 5,994,183 A | 11/1999 | Huang et al. |
| 7,074,690 B1 | 7/2006 | Gauri et al. |

(Continued)

FOREIGN PATENT DOCUMENTS

CN 104425209 A 3/2015

*Primary Examiner* — Duy T Nguyen
(74) *Attorney, Agent, or Firm* — Maschoff Brennan

(57) ABSTRACT

A semiconductor device includes first and second semiconductor fins extending from a substrate, and first and second epitaxial layers wrapping around the first and second semiconductor fins, respectively. The semiconductor device further includes a contact plug over the first epitaxial layer and the second epitaxial layer. The contact plug includes a first interfacial layer over the first epitaxial layer and a second interfacial layer over the second epitaxial layer. The first and second interfacial layers include a noble metal element and a Group IV element.

20 Claims, 25 Drawing Sheets

Related U.S. Application Data division of application No. 16/252,405, filed on Jan. 18, 2019, now Pat. No. 10,854,716.

(60) Provisional application No. 62/711,640, filed on Jul. 30, 2018.

(51) Int. Cl.

| | |
|---|---|
| *H01L 21/285* | (2006.01) |
| *H01L 21/762* | (2006.01) |
| *H01L 21/768* | (2006.01) |
| *H01L 21/8238* | (2006.01) |
| *H01L 23/535* | (2006.01) |
| *H01L 27/092* | (2006.01) |
| *H01L 29/165* | (2006.01) |
| *H01L 29/417* | (2006.01) |
| *H01L 29/45* | (2006.01) |
| *H01L 29/66* | (2006.01) |
| *H01L 21/311* | (2006.01) |

(52) U.S. Cl.
CPC .. *H01L 21/76224* (2013.01); *H01L 21/76802* (2013.01); *H01L 21/76876* (2013.01); *H01L 21/76883* (2013.01); *H01L 21/76897* (2013.01); *H01L 21/823814* (2013.01); *H01L 21/823821* (2013.01); *H01L 21/823871* (2013.01); *H01L 21/823878* (2013.01); *H01L 23/535* (2013.01); *H01L 27/0924* (2013.01); *H01L 29/165* (2013.01); *H01L 29/41725* (2013.01); *H01L 29/45* (2013.01); *H01L 29/665* (2013.01); *H01L 21/02164* (2013.01); *H01L 21/0217* (2013.01); *H01L 21/02271* (2013.01); *H01L 21/02529* (2013.01); *H01L 21/02532* (2013.01); *H01L 21/31116* (2013.01); *H01L 29/6653* (2013.01); *H01L 29/66545* (2013.01); *H01L 29/6656* (2013.01)

(58) Field of Classification Search
CPC ..... H01L 21/823871; H01L 21/823878; H01L 23/535; H01L 27/0924; H01L 29/165; H01L 29/41725; H01L 29/45; H01L 29/665; H01L 21/02164; H01L 21/0217; H01L 21/02271; H01L 21/02529; H01L 21/02532; H01L 21/31116; H01L 29/6653; H01L 29/66545; H01L 29/6656; H01L 21/28562; H01L 21/76804; H01L 21/76879; H01L 21/02356; H01L 23/485; H01L 23/53252; H01L 29/41791; H01L 21/02576; H01L 29/7848; H01L 29/7853; H01L 21/823431; H01L 21/823475; H01L 27/0886; H01L 29/66795; H01L 2029/7858

USPC ...................................................... 257/192

See application file for complete search history.

(56) References Cited

U.S. PATENT DOCUMENTS

| | | |
|---|---|---|
| 8,703,556 B2 | 4/2014 | Kelly et al. |
| 9,029,930 B2 | 5/2015 | Kelly et al. |
| 9,105,490 B2 | 8/2015 | Wang et al. |
| 9,166,010 B2 | 10/2015 | Kelly et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,170,297 B2 | 1/2019 | Pearlstein et al. |
| 10,475,654 B2 | 11/2019 | Wang et al. |
| 2002/0137297 A1* | 9/2002 | Kunikiyo ............ H01L 29/6656 257/E29.155 |
| 2005/0186341 A1 | 8/2005 | Hendrix et al. |
| 2010/0267232 A1* | 10/2010 | Shih .................. H01L 21/76846 257/E21.585 |
| 2011/0298058 A1* | 12/2011 | Kawasaki ........... H01L 29/7853 257/E27.059 |
| 2014/0217517 A1 | 8/2014 | Cai et al. |
| 2014/0252369 A1* | 9/2014 | Lee .................... H01L 29/66462 257/76 |
| 2015/0303118 A1* | 10/2015 | Wang ............. H01L 21/823481 257/401 |
| 2015/0380305 A1* | 12/2015 | Basker ................. H01L 21/845 257/77 |
| 2016/0099342 A1* | 4/2016 | Basker ............. H01L 29/41791 438/283 |
| 2017/0018464 A1 | 1/2017 | Kim et al. |
| 2018/0151683 A1 | 5/2018 | Yeo et al. |

\* cited by examiner

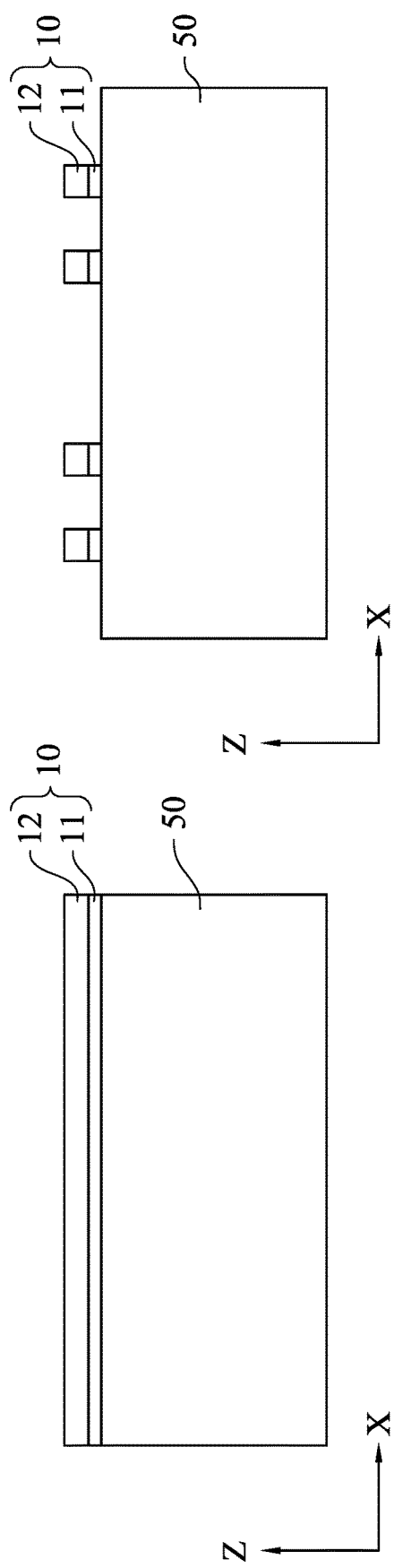
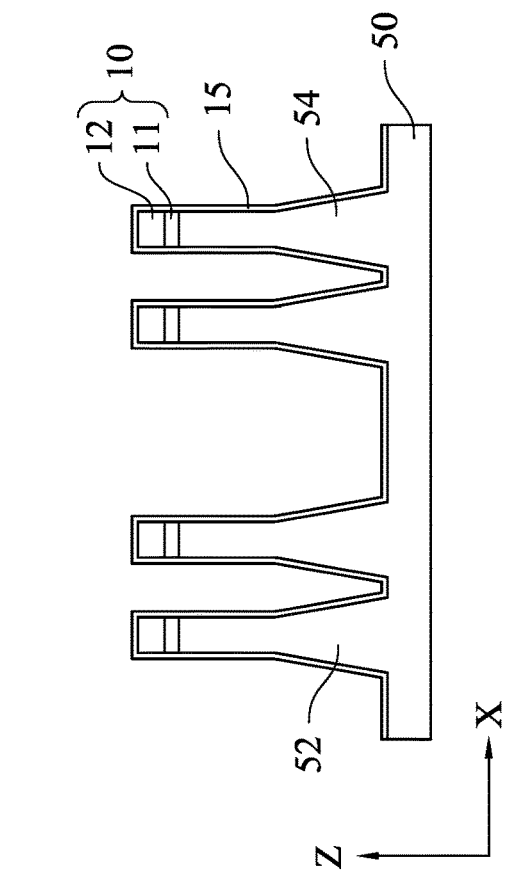
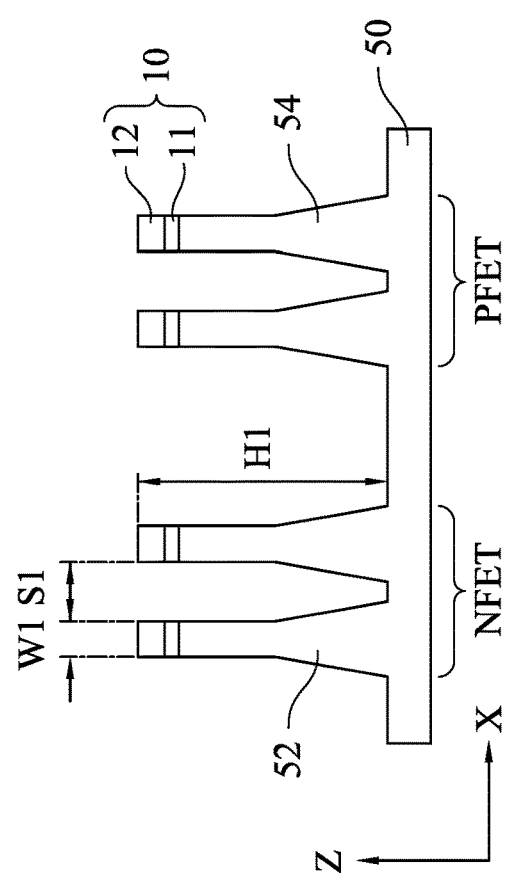

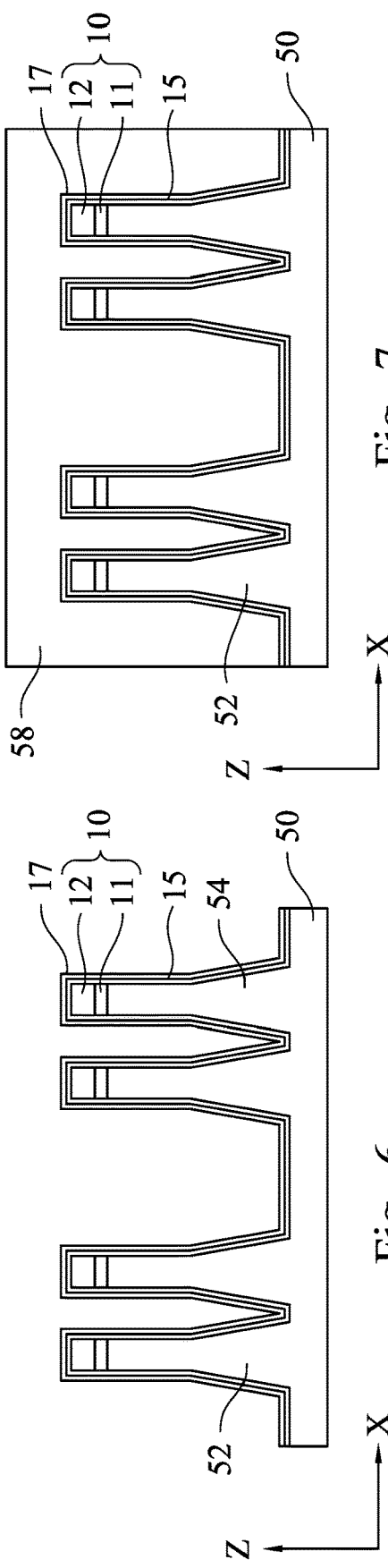
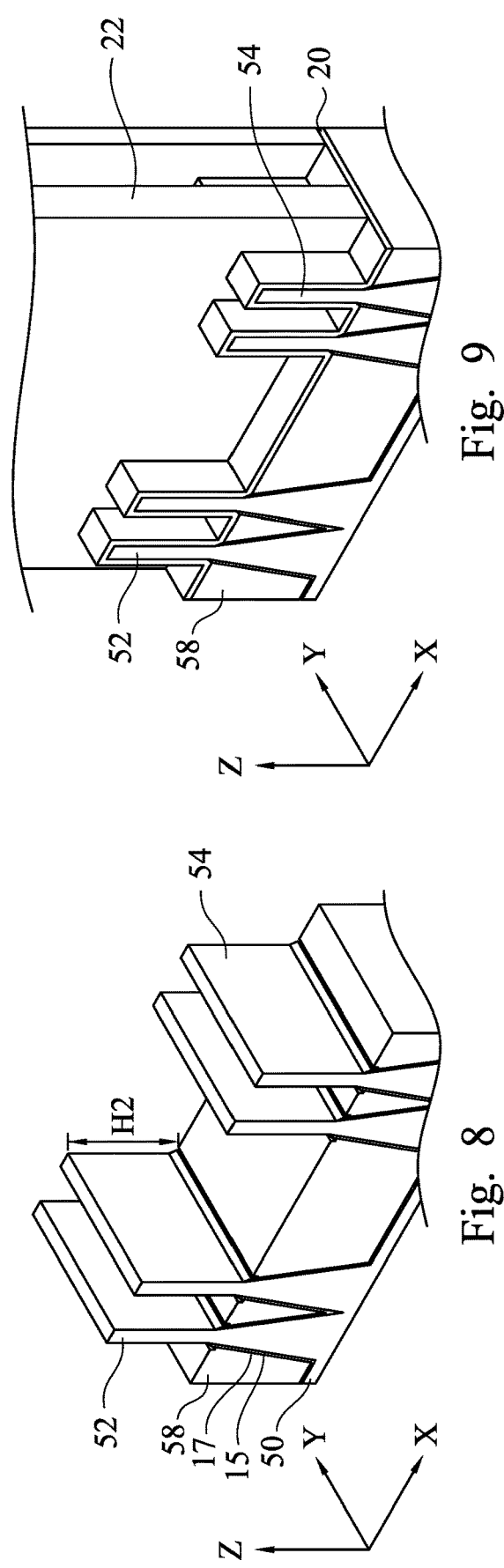

SEMICONDUCTOR DEVICE WITH SOURCE/DRAIN CONTACT FORMED USING BOTTOM-UP DEPOSITION

PRIORITY CLAIM AND CROSS-REFERENCE

The present application is a Continuation Application of the U.S. application Ser. No. 17/107,471, filed Nov. 30, 2020, now U.S. Pat. No. 11,715,763, issued Aug. 1, 2023, which is a Divisional Application of the U.S. application Ser. No. 16/252,405, filed Jan. 18, 2019, now U.S. Pat. No. 10,854,716, issued on Dec. 1, 2020, which claims priority to U.S. Provisional Application Ser. No. 62/711,640, filed Jul. 30, 2018, all of which are herein incorporated by reference in their entireties.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin-type field effect transistor (FinFET) and the use of a metal gate structure with a high-k (dielectric constant) material. The metal gate structure is often manufactured by using gate replacement technologies, and sources and drains are formed by using an epitaxial growth method. Source/drain contact plugs are also formed on the sources/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-16 show exemplary cross sectional views of various stages for manufacturing a FinFET according to some embodiments of the present disclosure.

DETAILED DESCRIPTION

Figure 1:
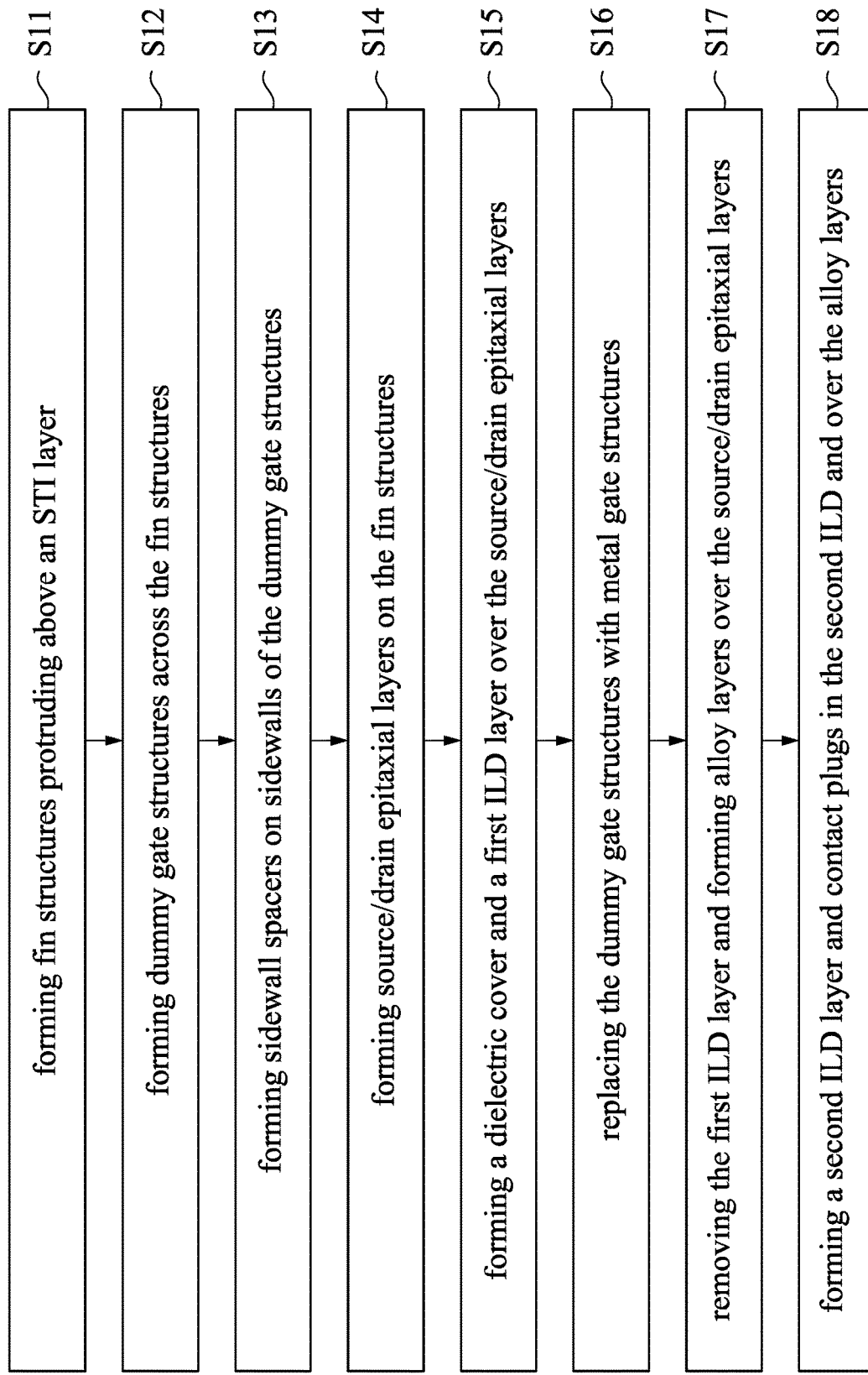
FIG. 1 is flow chart illustrating a method of forming source/drain contacts in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Fins of fin-type field effect transistors (FinFETs) may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates is a method of forming semiconductor devices in accordance with some embodiments. The method may be implemented on planar devices or multi-gate devices, such as FinFETs, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices. FIGS. 2-16 show exemplary cross sectional views of various stages for manufacturing a FinFET according to some embodiments of the present disclosure. In the subsequent discussion, the process steps shown in FIGS. 2-16 are discussed referring to the process steps in FIG. 1. It is understood that additional operations can be provided before, during, and after processes shown by FIGS. 2-16, and some of the operations described below can be replaced or eliminated, for additional embodiments of the method. The order of the operations/processes may be interchangeable.

In the manufacturing method for a FinFET, fin structures are formed. A mask layer 10 is formed over a substrate 50, as shown in FIG. 2. The mask layer 10 is formed by, for example, a thermal oxidation process and/or a chemical vapor deposition (CVD) process. The substrate 50 is, for example, a p-type silicon substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 50 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The substrate 50 may include various regions that have been suitably doped with impurities (e.g., p-type or n-type conductivity).

The mask layer 10 includes, for example, a pad oxide (e.g., silicon oxide) layer 11 and a silicon nitride mask layer 12, as shown in FIG. 2, in some embodiments. The pad oxide layer 11 may be formed by using thermal oxidation or a CVD process. The silicon nitride mask layer 12 may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes. The thickness of the pad oxide layer 11 is in a range from about 2 nm to about 15 nm and the thickness of the silicon nitride mask layer 12 is in a range from about 2 nm to about 50 nm in some embodiments.

A mask pattern is further formed over the mask layer. The mask pattern is, for example, a resist pattern formed by lithography operations. By using the mask pattern as an etching mask, a hard mask pattern of the pad oxide layer 11 and the silicon nitride mask layer 12 is formed, as shown in FIG. 3.

Then, as shown in FIG. 4, by using the hard mask pattern as an etching mask, the substrate 50 is patterned into fin structures 52 for an n-type FET and fin structures 54 for a p-type FET by trench etching using a dry etching method and/or a wet etching method. The dimensions for the fin structures 52 for an n-type FET may be the same as or different from those for the fin structures 54 for a p-type FET.

In FIG. 4, two fin structures 52 and two fin structures 54 are disposed over the substrate 50. However, the number of the fin structures is not limited to two. The numbers may be as small as one or more than three. In addition, one or more dummy fin structures may be disposed adjacent both sides of the fin structures 52 and/or the fin structures 54 to improve pattern fidelity in patterning processes.

The fin structures 52, 54 may be made of the same material as the substrate 50 and may continuously extend or protrude from the substrate 50. In this embodiment, the fin structures are made of Si. The silicon layers of the fin structures 52, 54 may be intrinsic, or appropriately doped with an n-type impurity or a p-type impurity.

The width W1 of the fin structures 52, 54 is in a range from about 5 nm to about 40 nm in some embodiments, and is in a range from about 7 nm to about 12 nm in other embodiments. The space S1 between two fin structures is in a range from about 10 nm to about 40 nm in some embodiments. The height H1 (along the Z direction) of the fin structures 52, 54 is in a range from about 100 nm to about 300 nm in some embodiments, and is in a range from about 50 nm to 100 nm in other embodiments.

The lower part of the fin structures 52, 54 may be referred to as a well region, and the upper part of the fin structures 52, 54, which is covered by a gate electrode may be referred to as a channel or a channel region, and the upper part of the fin structures 52, 54, which is not covered by the gate electrode may be referred to as a source and a drain, or a source region and a drain region. In this disclosure, "source" and "drain" may be collectively referred to as "source/drain." The height of the well region is in a range from about 60 nm to 100 nm in some embodiments, and the height of the channel region is in a range from about 40 nm to 120 nm, and is in a range from about 38 nm to about 60 nm in other embodiments.

After the fin structures 52, 54 are formed, a first protective layer 15 is formed to cover the structures 52, 54, as shown in FIG. 5. The first protective layer 15 is made of, for example, silicon oxide, silicon nitride (SiN) or silicon oxynitride (SiON). In an embodiment, the first protective layer 15 is made of SiN. The first protective layer 15 can be formed by CVD. The thickness of the first protective layer 15 is in a range from about 1 nm to about 20 nm in some embodiments.

After the first protective layer 15 is formed, a second protective layer 17 is formed as shown in FIG. 6. The second protective layer 17 is made of, for example, silicon oxide, silicon nitride (SiN) or silicon oxynitride (SiON) and is different from the first protective layer 15. In some embodiments, the second protective layer 17 is made of silicon oxide. The second protective layer 17 can be formed by CVD. The thickness of the second protective layer 17 is in a range from about 1 nm to about 20 nm in some embodiments.

Further, an isolation insulating layer 58 is formed in spaces between the fin structures and/or a space between one fin structure and another element formed over the substrate 50, as shown in FIG. 7. The isolation insulating layer 58 may also be called a "shallow-trench-isolation (STI)" layer. The insulating material for the isolation insulating layer 58 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Various chemistries are optionally added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous.

The insulating layer 58 is first formed in a thick layer as shown in FIG. 7 so that the fin structures 52 and 54 are embedded in the thick layer, and the thick layer is recessed so as to expose the upper portions of the fin structures 52 and 54, as shown in FIG. 8. The respective step is shown as step S11 in the process flow in FIG. 1. The insulating layer 58 can be recessed by using dry and/or wet etching. In some embodiments, the mask layers 11 and 12 and the first and second protective layers 15 and 17 are also removed from the exposed portions of the structures 52, 54.

The height H2 of the fin structures from the upper surface of the isolation insulating layer 58 is in a range from about 20 nm to about 100 nm in some embodiments, and is in a range from about 30 nm to about 50 nm in other embodiments. After or before recessing the isolation insulating layer 58, a thermal process, for example, an anneal process, may be performed to improve the quality of the isolation insulating layer 58. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

In some embodiments, a gate replacement technology is employed. After the insulating layer 58 is formed (and recessed), one or more dummy gate structures each including a dummy gate dielectric layer 20 and a dummy gate electrode layer 22 is formed over the fin structures 52, 54, as shown in FIG. 9. The respective step is shown as step S12 in the process flow in FIG. 1. As shown in FIG. 9, the gate structure extends in the X direction, while the fin structures extend in the Y direction.

To fabricate the dummy gate structure, a dielectric layer and a poly silicon layer are formed over the isolation insulating layer 58 and the exposed fin structures 52, 54, and then patterning operations are performed so as to obtain the dummy gate structure including a dummy gate electrode layer 22 made of poly silicon and a dummy gate dielectric layer 20. In some embodiments, the polysilicon layer is patterned by using a hard mask and the hard mask remains on the dummy gate electrode layer 22 as a cap insulating layer. The hard mask (cap insulating layer) includes one or more layers of insulating material. The cap insulating layer includes a silicon nitride layer formed over a silicon oxide layer in some embodiments. In other embodiments, the cap insulating layer includes a silicon oxide layer formed over a silicon nitride layer. The insulating material for the cap insulating layer may be formed by CVD, PVD, ALD, e-beam evaporation, or other suitable process. In some embodiments, the dummy gate dielectric layer 20 may include one or more layers of silicon oxide, silicon nitride, silicon oxy-nitride, or high-k dielectrics. In some embodiments, a thickness of the dummy gate dielectric layer 20 is in a range from about 2 nm to about 20 nm, and in a range from about 2 nm to about 10 nm in other embodiments. The height of the dummy gate structures is in a range from about 50 nm to about 400 nm in some embodiments, and is in a range from about 100 nm to 200 nm in other embodiments.

If a gate-first technology is employed, the dummy gate electrode layer 22 and the dummy gate dielectric layer 20 are used as a gate electrode and a gate dielectric layer.

Figure 10:
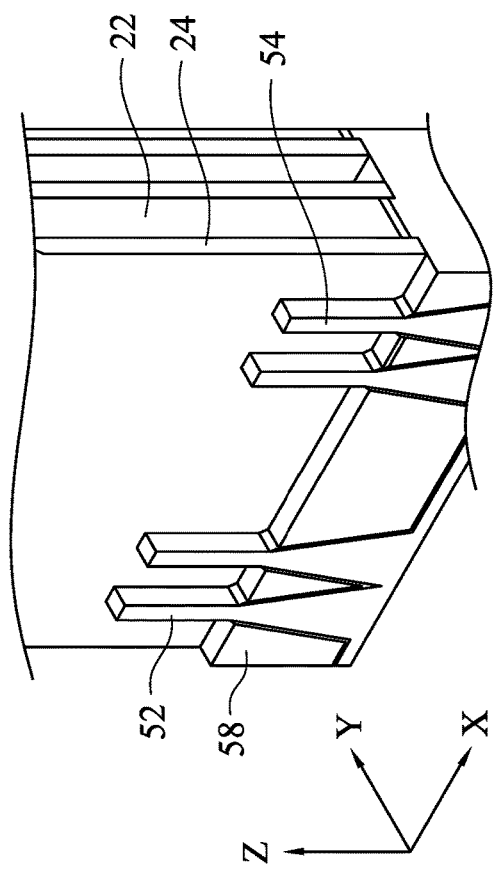
Figure 11:
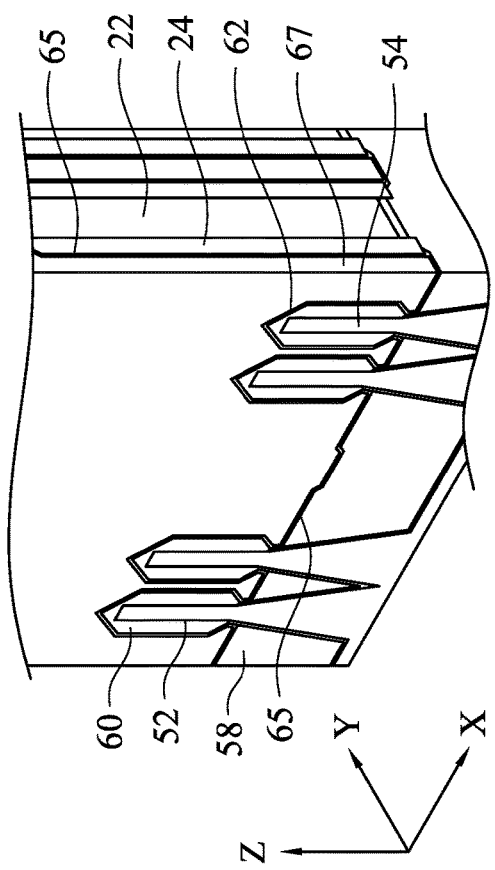

Afterwards, sidewall spacers 24 are formed on opposite sidewalls of the dummy gate electrode layer 22, as shown in FIG. 10. Then, as shown in FIG. 11, the sidewall spacers 24 formed on the fin structures 52, 54 are removed by using, for example, anisotropic dry etching, so as to expose source/drain regions of the structures 52, 54. The respective step is shown as step S13 in the process flow in FIG. 1. The sidewall spacers 24 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 24 are formed by forming a blanket layer of insulating material and performing anisotropic etching. In an embodiment, the sidewall spacer layers are made of silicon nitride based material, such as SiN, SiON, SiOCN or SiCN. The thickness of the sidewall spacers 24 is in a range from about 2 nm to about 10 nm in some embodiments.

Figure 12:
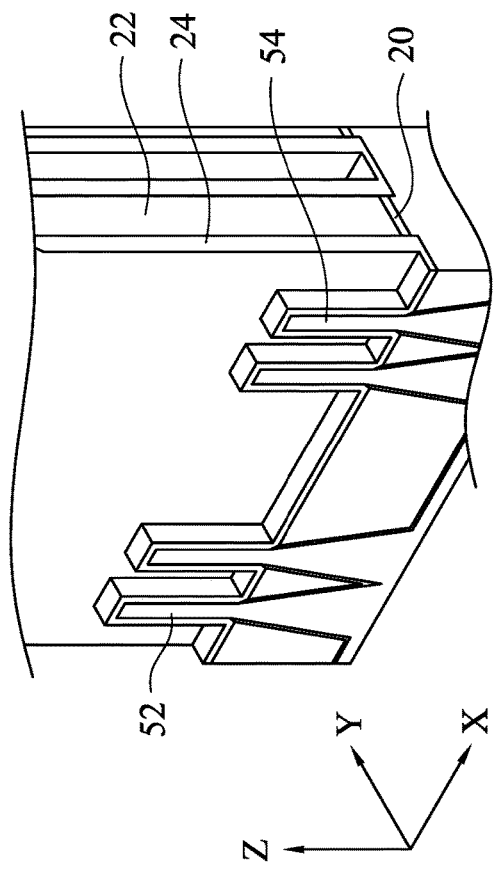

After the source/drain regions of the fin structures 52, 54 are exposed, source/drain epitaxial layers are formed, as shown in FIG. 12. The respective step is shown as step S14 in the process flow in FIG. 1. The source/drain epitaxial layer 60 for the n-type FET includes one or more layers of semiconductor material, such as, SiC, SiP and SiCP, which provides appropriate stress to the channel of the n-type FET, in some embodiments. When SiP or SiCP is used as multi epitaxial layers, the layers have different P and/or C concentrations. Since the fin structure 52 is a crystalline Si, the epitaxial layer 60 is also crystalline. The source/drain epitaxial layer 62 for the p-type FET includes one or more of a semiconductor material, such as, Ge and $Si_xGe_{1-x}$ where $0<x<1$, which provides appropriate stress to the channel of the p-type FET, in some embodiments. When SiGe is used as the multi epitaxial layers, the layers have different Ge concentrations. Since the fin structures 52, 54 are crystalline Si, the epitaxial layers 60, 62 are also crystalline. In certain embodiments, a Group III-V material which provides appropriate stress to the channel is used as the source/drain epitaxial layers 60 and/or 62. In some embodiments, the source/drain epitaxial layers 60 and/or 62 include multiple layers of epitaxially formed semiconductor materials.

The source/drain epitaxial layers 60, 62 may be grown at a temperature of about 400 to 800° C. under a pressure of about 80 to 150 Torr, by using a Si containing gas such as $SiH_4$, $Si_2H_6$ or $SiCl_2H_2$; a Ge containing gas, such as $GeH_4$, $Ge_2H_6$ or $GeCl_2H_2$; a C containing gas, such as $CH_4$ or $C_2H_6$; and/or a dopant gas, such as $PH_3$. The source/drain structure for an n-type FET and the source/drain structure for a p-type FET may be formed by separate epitaxial processes.

In the present disclosure, after the source/drain epitaxial layers 60, 62 are formed, the source/drain epitaxial layer 60 formed on one fin structure 52 is not in contact with (i.e., physically separated from) the source/drain epitaxial layer 60 formed on the adjacent fin structure 52 as shown in FIG. 12. Similarly, the source/drain epitaxial layer 62 formed on one fin structure 54 is not in contact with (i.e., physically separated from) the source/drain epitaxial layer 62 formed on the adjacent fin structure 54 as shown in FIG. 12. The space S2 between the source/drain epitaxial layers 60 (or 62) is in a range from about 5 nm to 15 nm in some embodiments. The thicknesses of the source/drain epitaxial layers 60 and 62 are adjusted to secure the desired space S2 depending on the space S1 (see, FIG. 4) between two fin structures.

Figure 13:
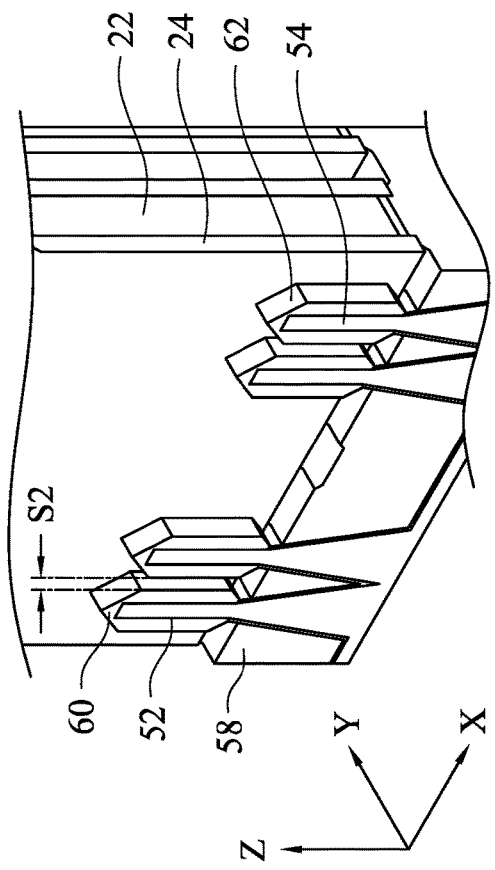

After the source/drain epitaxial layers 60 and 62 are formed, a dielectric cover layer 65 is formed over the source/drain epitaxial layers 60 and 62 and a first interlayer dielectric (ILD) layer 67 is formed over the dielectric cover layer 65, as shown in FIG. 13. The respective step is shown as step S15 in the process flow in FIG. 1. The dielectric cover layer 65 is made of, for example, SiN or SiON, and has a thickness in a range from about 2 nm to about 20 nm in some embodiments. The first ILD 67 is made of a different material than the dielectric cover layer 65 and is made of, for example, one or more layers of silicon oxide, SiCN, SiOCN or a low-k material.

Figure 14:
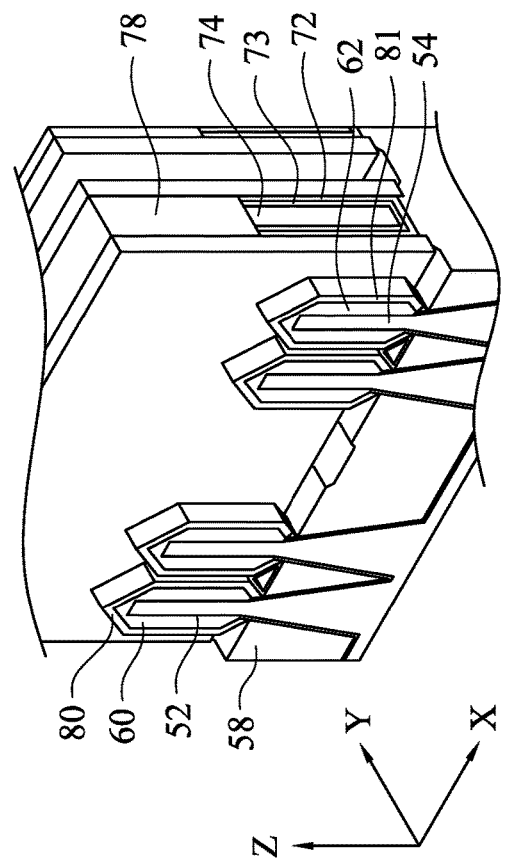

After the ILD layer 67 is formed, one or more metal gate structures are formed. The dummy gate structures (the dummy gate electrode layer 22 and the dummy gate dielectric layer 20) are removed and replaced with metal gate structures. In certain embodiments, the first ILD layer 67 is formed over the dummy gate structures and a planarization operation, such as a chemical mechanical polishing (CMP) process or an etch-back process, is performed to expose the upper surface of the dummy gate electrode layer 22. Then, the dummy gate electrode layer 22 and the dummy gate dielectric layer 20 are removed, by appropriate etching processes, respectively, to form a gate opening. A metal gate structure including a gate dielectric layer 72, one or more work function adjustment layers 73 and a metal gate electrode layer 74 are formed in the gate openings, as shown in FIG. 14. The respective step is shown as step S16 in the process flow in FIG. 1.

The gate dielectric layer 72 may be formed over an interface layer (not shown) disposed over the channel layer of the fin structures 52, 54. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 72 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 72 is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The one or more work function adjustment layers 73 are formed over the gate dielectric layer 72, as shown in FIG. 14. The work function adjustment layer 73 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

The metal gate electrode layer 74 is formed over the one or more work function adjustment layers 73. The metal gate electrode 74 includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

After depositing appropriate materials for the metal gate structure, planarization operations, such as CMP, are performed. Further, in some embodiments, the metal gate structure is recessed to form a cap space, and the cap space is filled with an insulating material 78, as shown in FIG. 14.

After the metal gate structure is formed, the first ILD layer 67 and dielectric cover layer 65 are removed. In some embodiments, the first ILD layer 67 and dielectric cover layer 65 are fully removed and in other embodiments, the first ILD layer 67 and dielectric cover layer 65 are partially removed from an area around the source/drain structures.

Figure 15:
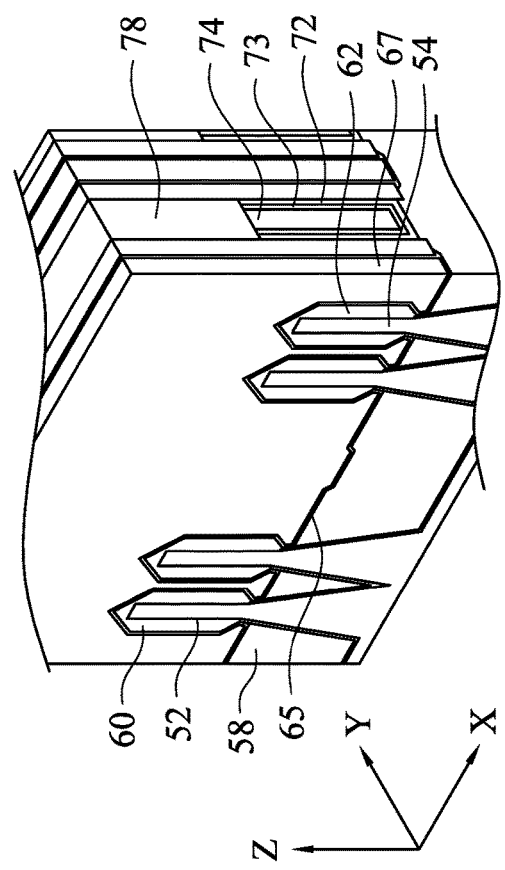

After the first ILD layer 67 is at least partially removed, metal alloy layers 80 and 81 are respectively formed over the source/drain epitaxial layers 60 and 62, as shown in FIG. 15. The respective step is shown as step S17 in the process flow in FIG. 1.

The metal alloy layers 80 are 81 alloys made of one or more Group IV element and one or more transition metal elements. When the source/drain epitaxial layers 60 and 62 are formed by silicon, the metal alloy layers 80 and 81 are silicide layers. When the source/drain epitaxial layers 60 and 62 are formed by germanium, the metal alloy layers 80 and 81 are germanide layers. When the source/drain epitaxial layer 60 and 62 are formed by SiGe, the metal alloy layer 80 and 81 are silicide-germanide layers.

The transition metal includes one or more of Ti, Ta, Ru, Pt, Ni and Co. The alloy layer 80 or 81 is one or more of TiSi, TaSi, RuSi, PtSi, NiSi, CoSi, TiSiGe, TaSiGe, NiSiGe and CoSiGe.

After the first ILD layer 67 is removed, transition metal is deposited by, for example, CVD, ALD or PVD, on the source/drain epitaxial layers 60 and 62. During the deposition, the deposited transition metal reacts with Si and/or Ge in the source/drain epitaxial layers 60 and 62, thereby forming the alloy layers 80 and 81 in some embodiments. In some embodiments, silicide (alloy) layer can be formed by PECVD, CVD, PEALD, or ALD metal deposit in a temperature range of about 250 to 700° C., and then an in-situ dry etching using Cl-based or F-based gas or ex-situ wet selective etching is applied to remove the remaining metal on spacer and the isolation insulating layer. In other embodiments, the silicide (alloy) layer can be formed by PECVD, CVD, PEALD, or ALD metal deposit in a temperature range of about 350 to 650° C. In some embodiments, a nitridation treatment is later performed to passivate silicide surface for the subsequent silicide formation anneal. In other embodiments, a selective silicide deposition process through surface blocking by self-assembly molecular (SAMs), or inherent selective formation from proper metal and silicon precursors is performed. Other suitable silicide formation processes may be utilized.

In the present embodiments, before the alloy layers 80 are formed, the source/drain epitaxial layer 60 on one of the fin structures 52 is separated from the source/drain epitaxial layer 60 on the adjacent fin structure 52, and the source/drain epitaxial layer 62 on one of the fin structures 54 is separated from the source/drain epitaxial layer 62 on the adjacent fin structure 54. The alloy layers 80 and 81 are formed such that the resulting alloy layers 80 on the separated source/drain epitaxial layers 60 are separated, and the resulting alloy layers 81 on the separated source/drain epitaxial layers 62 are separated as well.

In some embodiments, after a transition metal layer is formed on the source/drain epitaxial layers 60 and 62, an annealing operation is performed to form the alloy layers 80 and 81. The annealing operation is performed at a temperature of about 250° C. to about 850° C.

Figure 16:
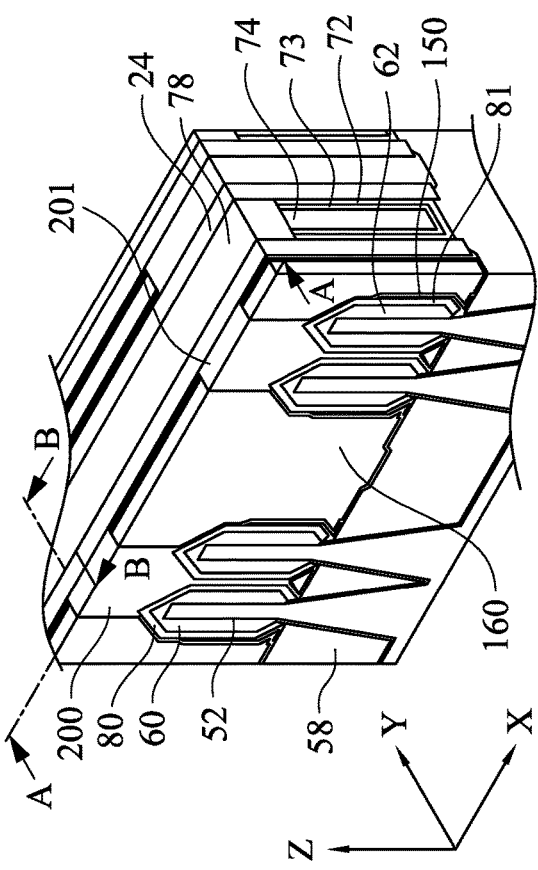

After the alloy layers 80 and 81 are formed, a contact-etch stop layer (CESL) 150 is formed to cover the alloy layer 80, 81, and a second ILD layer 160 is formed on the CESL 150, as shown in FIG. 16. The CESL 150 is made of a silicon nitride based material, such as SiN and SiON, and has a thickness in a range from about 2 nm to about 20 nm in some embodiments. The second ILD 160 is made of a different material than the CESL 150 and is made of, for example, one or more layers of silicon oxide, SiCN, SiOCN or a low-k material.

Subsequently, a patterning operation is performed to form contact openings over the alloy layers 80 and 81 of the source/drain structures, and the openings are filled with a conductive material, thereby forming contact plugs 200 and 201, as shown in FIG. 16. The respective step is shown as step S18 in the process flow in FIG. 1. The contact plugs 200 and 201 are formed using a selective bottom-up deposition technique to fill a gap between the neighboring alloy layers, which will be described further below.

FIGS. 17A-20B are exemplary cross-sectional views at various stages of forming contact plugs according to some embodiments of the present disclosure. In FIGS. 17A-20B, the "A" figures (e.g., FIG. 17A) illustrate a cross-sectional view along X direction corresponding to the line A-A illustrated in FIG. 16, and the "B" figures (e.g., FIG. 17B) illustrate a cross-sectional view along the Y direction corresponding to the line B-B illustrated in FIG. 16. In FIGS. 17A-20B, an n-channel FET (NFET) and a p-channel FET (PFET), each of which includes two fin structures 52, 54 are illustrated as adjacent to each other. However, the configuration is not limited to this. The number of the fin structures may be three or more and one or more additional structures may be disposed between the NFET and the PFET.

Figure 17A:
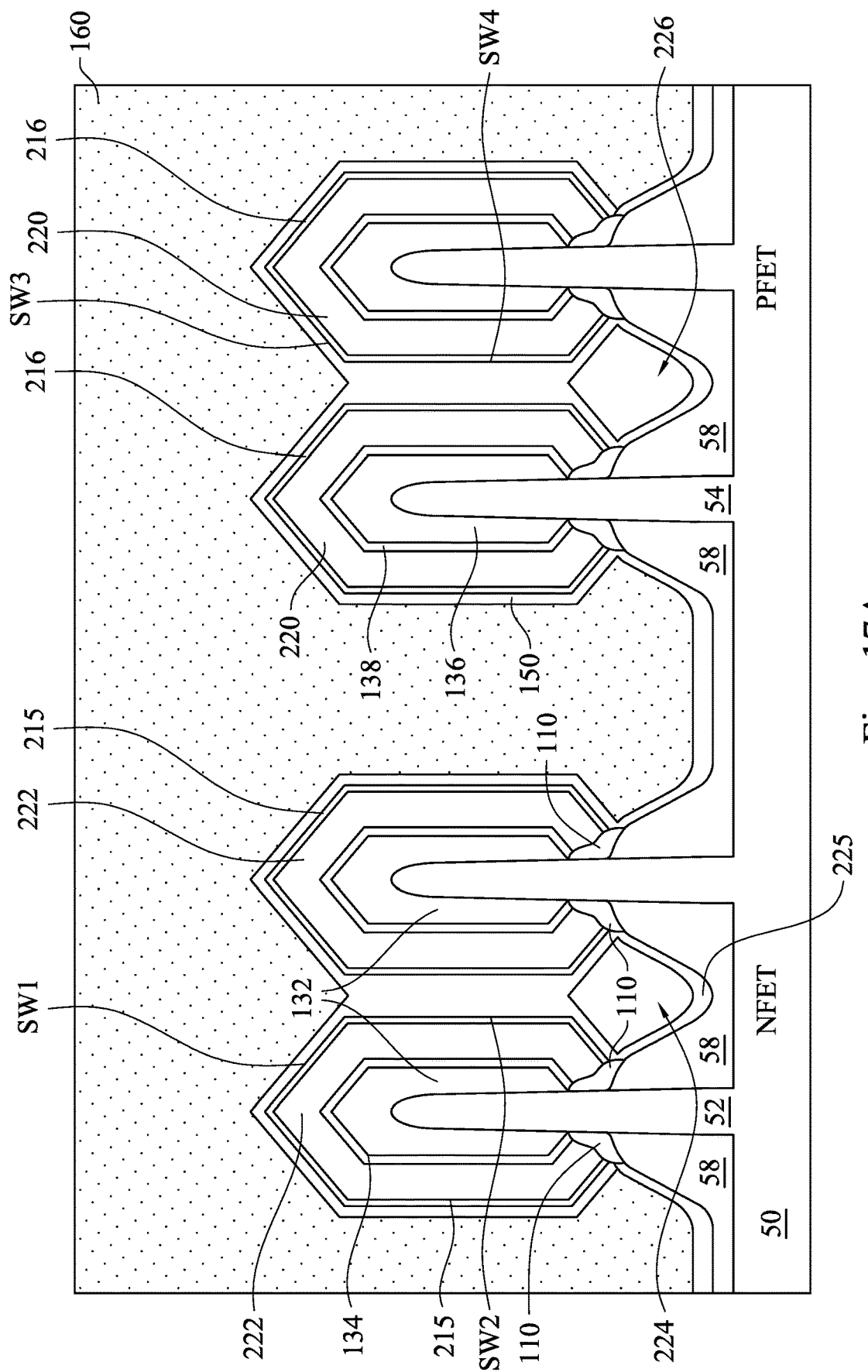
FIGS. 17A, 18A, 19A and 20A are exemplary cross-sectional views corresponding to the line A-A illustrated in FIG. 16 at various stages of forming contact plugs according to some embodiments of the present disclosure.
Figure 17B:
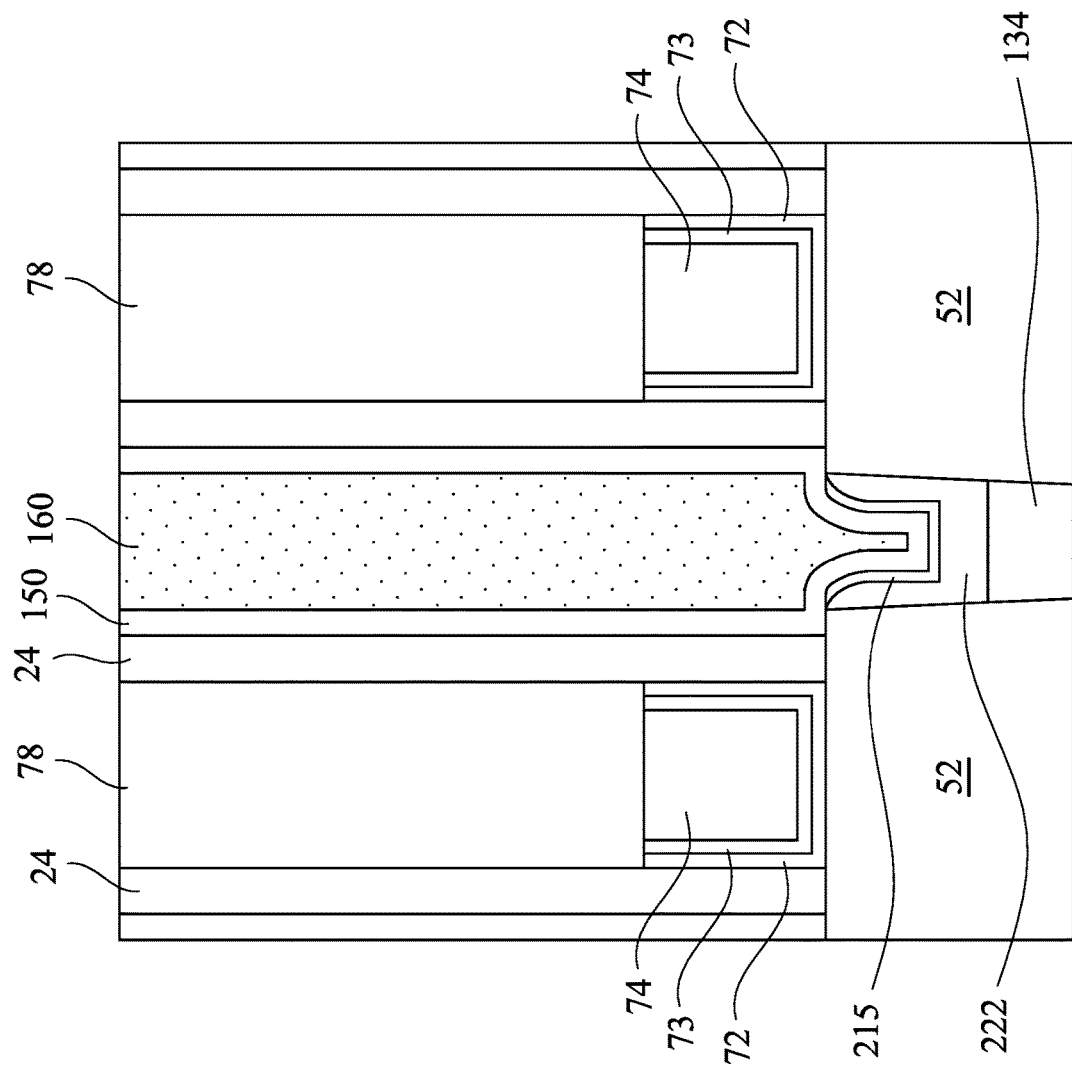
FIGS. 17B, 18B, 19B and 20B are exemplary cross-sectional views corresponding to the line B-B illustrated in FIG. 16 at various stages of forming contact plugs according to some embodiments of the present disclosure.

In FIGS. 17A and 17B, in the n-channel FET (NFET), a first n-type epitaxial layer 132 is formed on the fin structure 52, and a second n-type epitaxial layer 134 is formed on the first n-type epitaxial layer 132. The first and second n-type epitaxial layers are crystalline semiconductor layers, such as Si, SiC, SiCP, SiP, Ge and SiGe, having different lattice constants from each other and from the fin structure. When SiC, SiP and/or SiCP are used, the C or P concentration of the second n-type epitaxial layer 134 is higher than that of the first n-type epitaxial layer 132. In some embodiments, a Group III-V semiconductor layer is used for at least one of the first and second n-type epitaxial layers. The combination of the first and second n-type epitaxial layers 132 and 134 correspond to the source/drain epitaxial layer 60 shown in FIG. 16. In other embodiments, only one of the first and second n-type epitaxial layers 132 and 134 is formed, and in certain embodiments, three or more n-type epitaxial layers are formed.

Further, the alloy layers 222, for example, silicide layers, which correspond to the alloy layers 80 shown in FIG. 16, are formed on the second n-type epitaxial layers 134, respectively. The alloy layers 222 are formed by a reaction between the material of the second n-type epitaxial layer 134 and a transition metal layer formed thereon. As shown in FIG. 17A, the second n-type epitaxial layer 134 of one of the adjacent two fin structures 52 does not touch the second n-type epitaxial layer 134 of the other one of the adjacent two fin structures 52. The alloy layers 222 formed on the respective second n-type epitaxial layers 134 are not merged and thus separated.

In some embodiments, a surface layer of the alloy layer 222 can be converted to a nitridated alloy cap 215 by a nitridation operation by using $NH_3$ or $N_2+H_2$ plasma in some embodiments. The nitridated alloy cap 215 covers the surface of the alloy layer 222 to protect the alloy layer 222 from damages caused by the subsequent processes, such as metal diffusion from the subsequently formed contact plug 200. The nitridated alloy caps 215 on the neighboring fin structures 52 each include an up-slant sidewall SW1 and a vertical sidewall SW2 extending downwardly from a bottom of the up-slant sidewall SW1 along a direction non-parallel to the up-slant sidewall SW1. This is due to the fact that the nitridated alloy cap 215 wraps around facets of the epitaxial layer 134 extending along different crystal planes (i.e., having different crystal orientations).

A transition metal layer 225 remains at the bottom of the void 224 formed by the alloy layer 222 and the isolation insulating layer 58. The volume of the transition metal layer 225 is sufficiently small so as not to affect electrical properties of the NFET. Further, spacer residues 110, which are a remaining part of the sidewall spacers 24 that is not etched in the operation of FIG. 11, exist.

The p-channel FET (PFET) shown in FIG. 17A has the same or similar structure as the n-channel FET (NFET), and explanations for the common configurations may be omitted. A first p-type epitaxial layer 136 is formed on the fin structure 54, and a second p-type epitaxial layer 138 is formed on the first p-type epitaxial layer 136. The first and second p-type epitaxial layers are crystalline semiconductor layers, such as Si, SiC, SiCP, SiP, Ge and SiGe, having different lattice constants from each other and from the fin structure. When SiGe is used, the Ge concentration of the second p-type epitaxial layer 138 is higher than that of the first p-type epitaxial layer 136. In some embodiments, a Group III-V semiconductor layer is used for at least one of the first and second p-type epitaxial layers. The combination of the first and second p-type epitaxial layers 136 and 138 correspond to the source/drain epitaxial layer 62 shown in FIG. 16. In other embodiments, only one of the first and second p-type epitaxial layers 136 and 138 is formed, and in certain embodiments, three or more p-type epitaxial layers are formed.

Further, the alloy layers 220, for example, silicide layers, which correspond to the alloy layers 81 shown in FIG. 16, are formed on the respective second p-type epitaxial layers 138. The alloy layer 220 is formed by a reaction between the material of the second p-type epitaxial layer 138 and a transition metal layer formed thereon. As shown in FIG. 17A, the second p-type epitaxial layer 138 of one of the adjacent two fin structure 54 does not touch the second p-type epitaxial layer 138 of the other one of the adjacent two fin structure 54. The alloy layers 220 formed on the respective second p-type epitaxial layers 138 are not merged and thus separated.

In some embodiments, a surface layer of the alloy layer 220 can be converted to a nitridated alloy cap 216 by the nitridation operation as discussed previously with respect to formation of the nitridated alloy cap 215. The nitridated alloy cap 216 covers the surface of the alloy layer 222 to protect the alloy layer 222 from damages caused by the subsequent processes, such as metal diffusion from the contact plug 201. The nitridated alloy caps 216 on the neighboring fin structures 54 each include an up-slant sidewall SW3 and a vertical sidewall SW4 extending downwardly from a bottom of the up-slant sidewall SW3 along a direction non-parallel to the up-slant sidewall SW3. This is due to the fact that the nitridated alloy cap 216 wraps around facets of the epitaxial layer 138 extending along different crystal planes.

A transition metal layer 225 remains at the bottom of the void 226 formed by the alloy layer 220 and the isolation insulating layer 58. The volume of the transition metal layer 225 is sufficiently small so as not to affect electrical properties of the PFET. Further, spacer residues 110, which are a remaining part of the sidewall spacers 24 that is not etched in the operation of FIG. 11, exist.

Figure 18A:
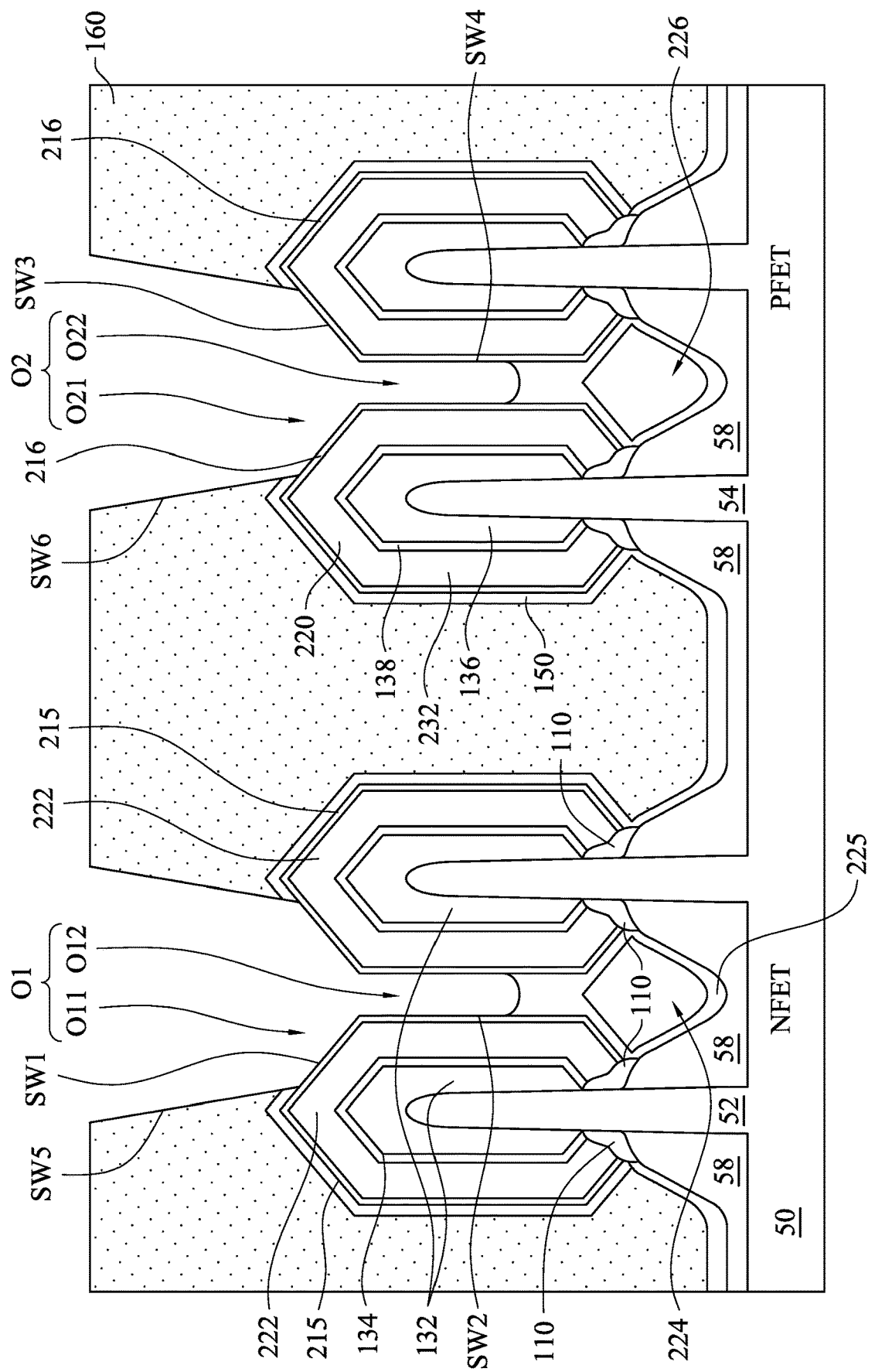
Figure 18B:
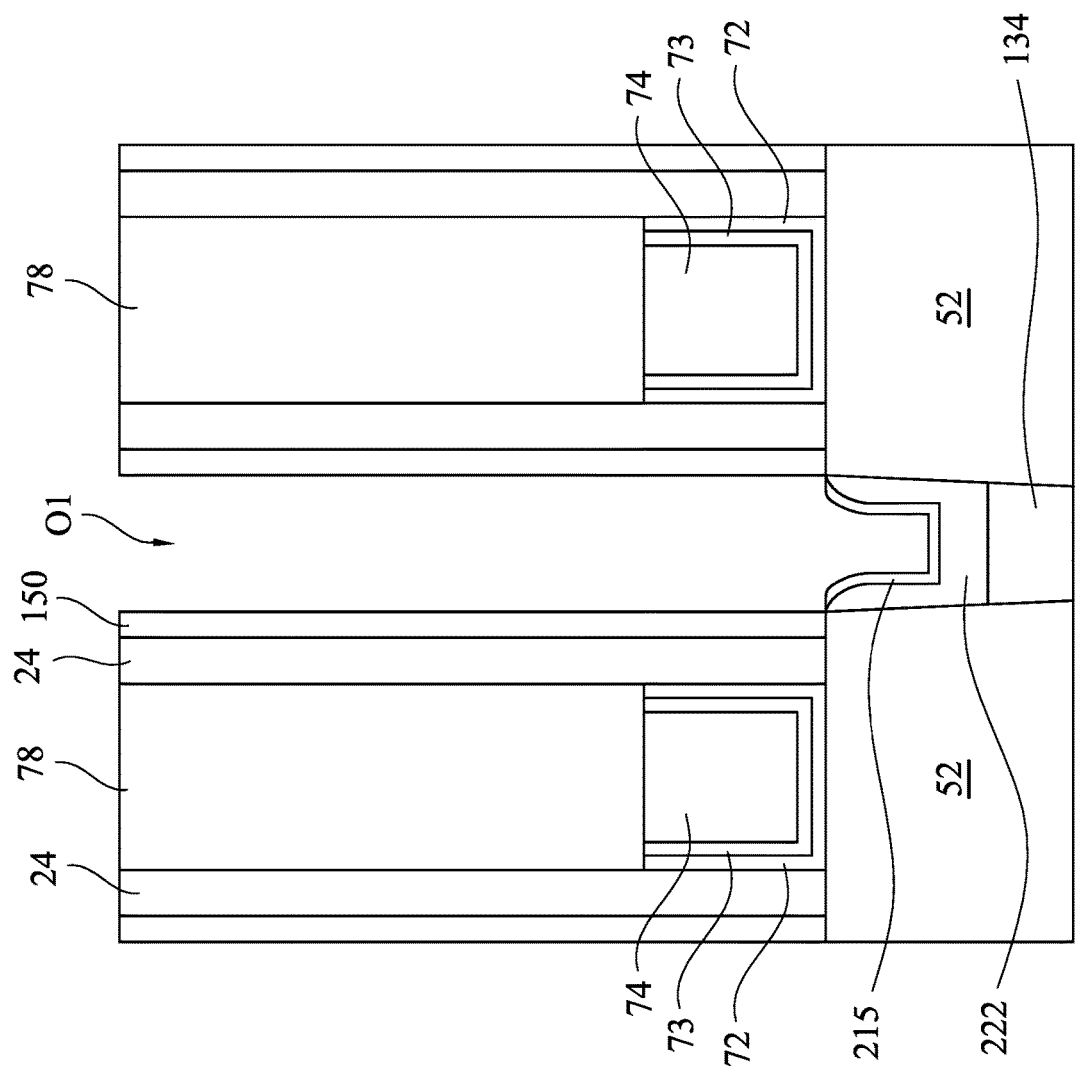

The contact etch stop layer (CESL) 150 is formed as a blanket layer to cover an entirety of the NFET and PFET, and the second ILD layer 160 is form to cover an entirety of the CESL 150. Contact openings O1 and O2 are then etched in the second ILD layer 160 and through the CESL 150 to expose the nitridated alloy caps 215 and 216, respectively. The resulting structure is illustrated in FIGS. 18A and 18B. The contact opening O1 includes a tapered opening O11 and a gap O12 extending downwardly from a bottom of the tapered opening O11. The gap O12 is defined by vertical sidewalls SW2 of the nitridated alloy cap 215, and the tapered opening O11 is defined by up-slant sidewalls SW1 of the nitridated alloy cap 215 and up-slant sidewalls SW5 of the second ILD layer 160 having different slopes than up-slant sidewalls SW1 of the nitridated alloy cap 215. Similarly, the contact opening O2 includes a tapered opening O21 and a gap O22 extending downwardly from a bottom of the tapered opening O21. The gap O22 is defined by vertical sidewalls SW4 of the nitridated alloy cap 216, and the tapered opening O21 is defined by up-slant sidewalls SW3 of the nitridated alloy cap 216 and up-slant sidewalls SW6 of the second ILD layer 160 having different slopes than the up-slant sidewalls SW3. The width of the gap O21 or O22 is in a range from about 3 nm to about 15 nm in some embodiments. The width of the gap O12 or O22 is controlled to facilitate the following bottom-up deposition using the capillary condensation mechanism, which will be discussed in detail below. If the width of the gap O21 or O22 is greater than about 15 nm or less than about 3 nm, it might adversely affect the following bottom-up deposition process.

Figure 19A:
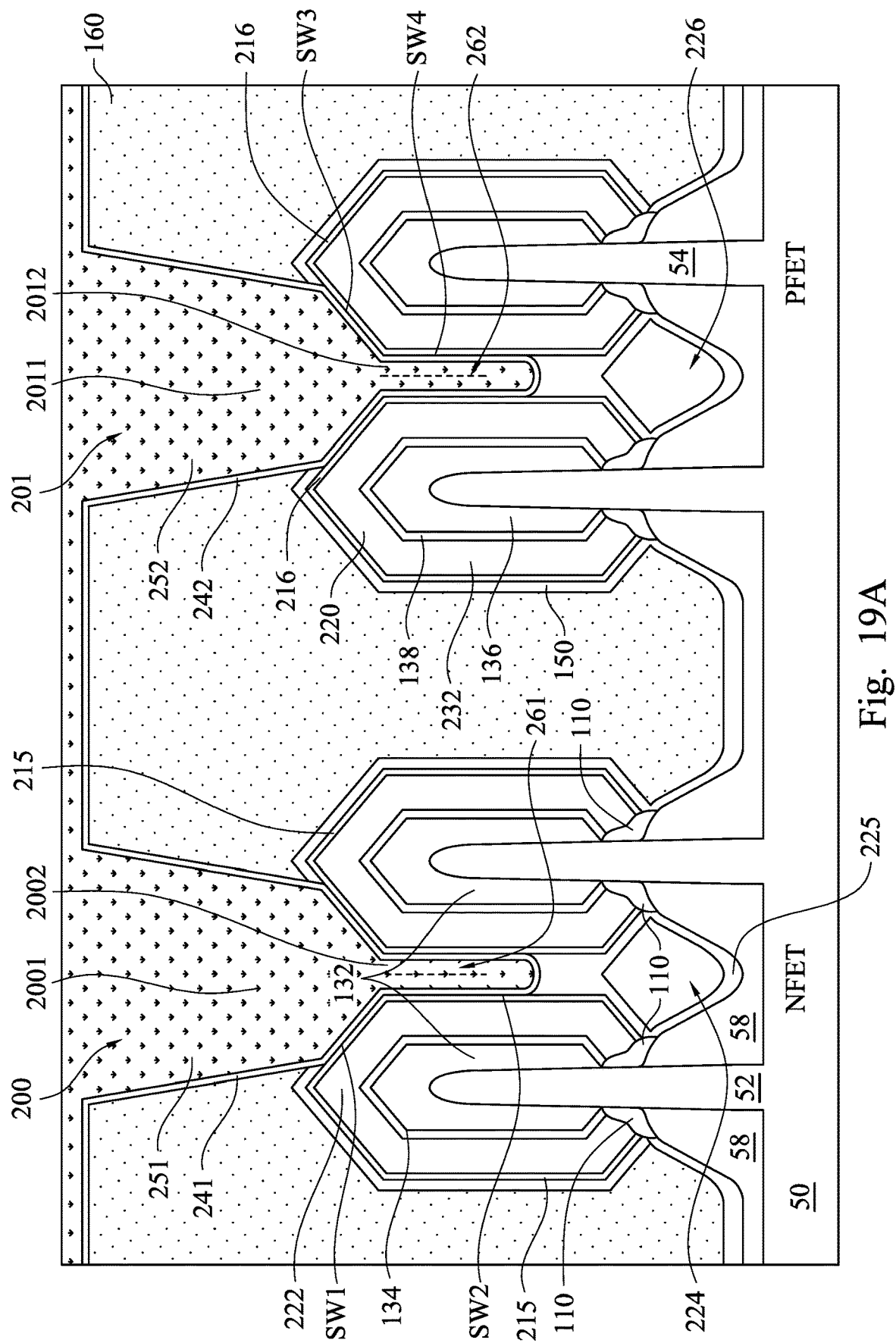
Figure 19B:
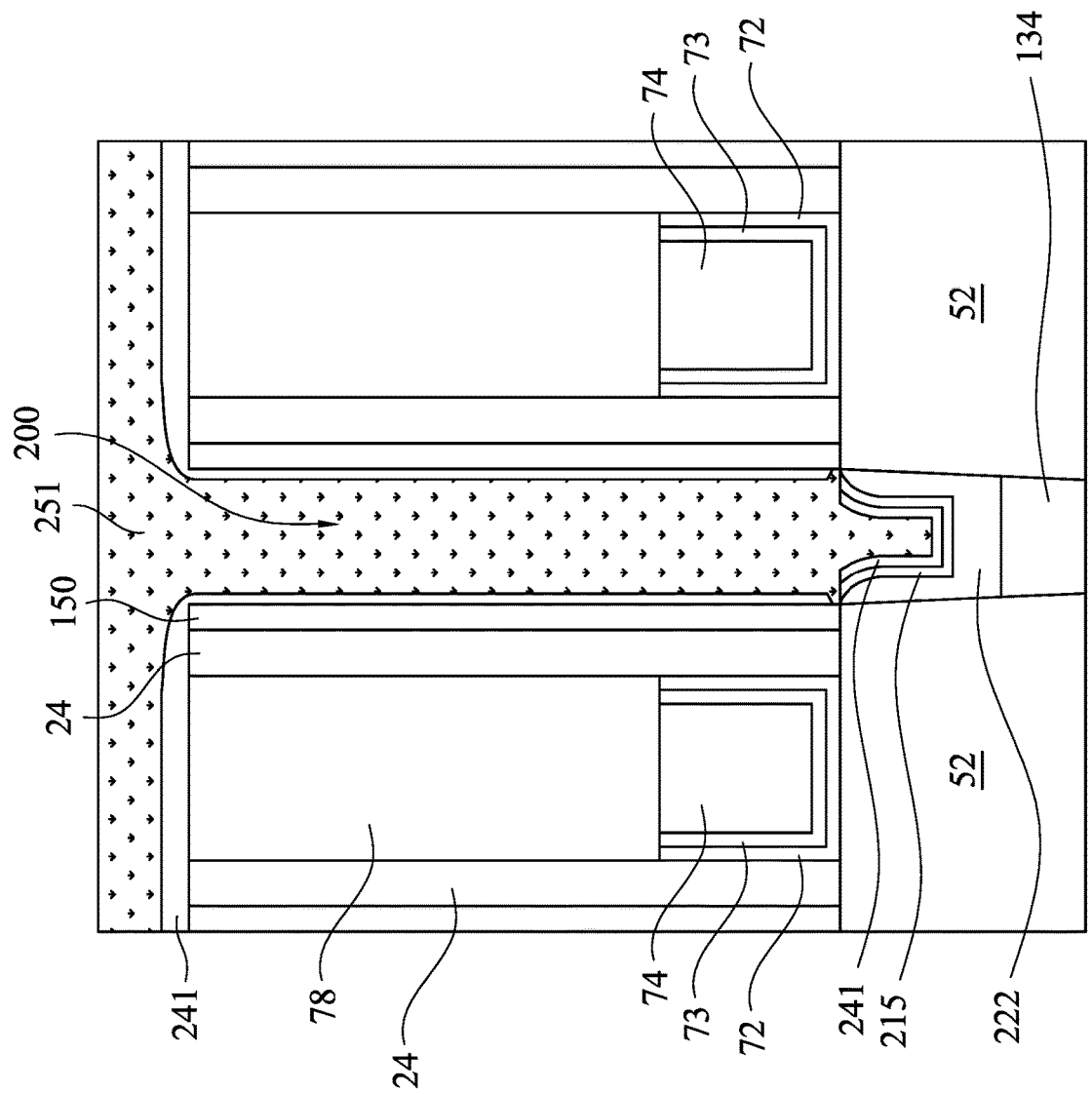

The contact plugs 200 and 201 are then formed in the respective contact openings O1 and O2, as illustrated in FIGS. 19A and 19B. The contact plugs 200 and 201 are deposited using a bottom-up approach, so that the narrow gaps O12 and O22 (as shown in FIG. 18A) can be substantially filled with the contact plugs 200 and 201, respectively. In certain embodiments, the bottom-up deposition is a CVD deposition process involving a capillary condensation mechanism and thus is equivalently referred to as a capillary condensation CVD process hereinafter.

The capillary condensation CVD process selectively deposits metal in the narrowest confined spaces on the substrate, such as the gaps O12 and O22 of the contact openings O1 and O2. The precursor of the capillary condensation CVD process is initially provided in a vapor phase at a partial pressure (e.g., from 0.01 mT to about 0.1 mT) below its saturation pressure. If the partial pressure of the precursor is greater than about 0.1 mT or less than about 0.01 mT, the capillary condensation mechanism might be unsatisfactory. Due to capillary condensation mechanism, the precursor vapor condenses as a liquid in the narrowest gaps (i.e., the gaps O12 and O22) even if the partial pressure of the precursor vapor is below its saturation pressure. This is due to an increased number of van der Waals interactions between vapor phase molecules inside the confined space of capillaries (i.e., the gaps O12 and O22). This propensity is employed to selectively fill the narrow gaps O12 and O22 between the non-merged alloy layers with the precursor liquid. With the precursor liquid selectively confined to narrowest gaps, the precursor liquid is converted into a solid-phase deposited metal. This conversion may be achieved physically for example by solidification, or chemically by reacting the precursor liquid with another material to produce the solid material, or by decomposing the precursor.

Metal deposition using the capillary condensation CVD begins from the narrowest confined spaces, which in turn results in a "bottom-up" filling phenomenon instead of a "conformal" deposition phenomenon, thus substantially filling the gaps O12 and O22 with the contact plugs 200 and 201. In this way, the narrow gap between vertical sidewalls of the nitridated alloy caps can be filled by metal, not by silicide, germanide or metal nitride, which in turn will achieve reduced contact resistance because metal has lower resistance than silicide, germanide or metal nitride. In some embodiments, the capillary condensation CVD process is performed until that the contact openings O1 and O2 are overfilled with metal, as illustrated in FIGS. 19A and 19B.

In some embodiments, the precursor of the capillary condensation CVD may be, for example, metal carbonyl, metal halide, the like or combinations thereof, and the carrier gas may include, for example, argon gas, hydrogen gas, the like, or combinations thereof. In some embodiments, an additional inhibition gas is employed during the capillary condensation CVD process. The inhibition gas can improve "bottom-up" filling phenomenon because it inhibits metal nucleation on dielectric (e.g., on sidewalls of tapered openings O11 and O21 in the ILD layer 160). In some embodiments where the precursor includes metal carbonyl, the inhibition gas includes, for example, carbon monoxide (CO). In some embodiments where the precursor includes metal halide, the inhibition gas includes, for example, hydrogen halide.

In some embodiments, noble metals (e.g., ruthenium) are promising candidates for the contact plugs 200 and 201 compared to non-noble metals such as copper. This is at least due to that the noble metals exhibit lower metal diffusion than non-noble metals (e.g., copper). As a result, a diffusion barrier layer deposited prior to formation of the contact plugs 200 and 201 can be omitted if the contact plugs 200 and 201 include the noble metal (e.g., ruthenium). Omission of the diffusion barrier will contributes to an improved process window for depositing the contact plugs 200 and 201 into the narrow gaps O12 and O22.

At an initial stage of the deposition, the noble metal (e.g., ruthenium) may react with silicon and/or germanium in the exposed regions (e.g., silicon and/or germanium in the silicon-containing and/or germanium-containing nitridated alloy caps 215 and 216 and in the sidewalls of contact openings O1 and O2 in the silicon-containing ILD layer 160), thereby forming interfacial layers 241 and 242 that contain the noble metal element and the Group IV element (e.g., silicon and/or germanium). At a following stage of the deposition, the noble metal is not reacted with silicon and/or germanium, which in turn results in silicon-free and/or germanium-free noble metal structures 251 and 252 formed on the respective interfacial layers 241 and 242. In this way, the interfacial layer 241 improves adhesion of the silicon-free and/or germanium-free noble metal structure 251 to the nitridated alloy cap 215 and ILD layer 160. Similarly, the interfacial layer 242 improves adhesion of the silicon-free and/or germanium-free ruthenium structure 252 to the nitridated alloy cap 215 and ILD layer 160.

In some embodiments, a pre-clean process is performed prior to the capillary condensation CVD process. The pre-clean includes ion bombardment using hydrogen ($H_2$), argon, helium, nitrogen ($N_2$), the like, or combinations thereof. As a result of the bombardment, bonds of the dielectric materials (such as silicon oxide and/or nitride) exposed by the contact openings O1 and O2 may be broken or loosen, which will facilitate formation of the interfacial layers 241 and 242 by reacting the noble metal with silicon resulting from the broken bonds in the dielectric materials.

In some embodiments where the noble metal is ruthenium, the precursor may be, for example, ruthenium carbonyl, ruthenium tricarbonyl, ruthenium halide, the like or combinations thereof, and the carrier gas may include, for example, argon gas, hydrogen gas, the like or combinations thereof.

In some embodiments where the precursor is ruthenium tricarbonyl, formation of contact plugs 200 and 201 may be a cyclic process including one or more repetitions of a deposition cycle and a cleaning cycle. For example, it may perform a deposition cycle followed by a cleaning cycle, and repeats the deposition and cleaning cycles. In some embodiments, the deposition cycle involves the capillary condensation CVD process as discussed previously. In the deposition cycle, ruthenium tricarbonyl precursor is initially provided in a vapor phase at a partial pressure (e.g., from 0.01 mT to about 0.1 mT) below its saturation pressure. If the partial pressure of the ruthenium trycarbonyl is greater than about 0.1 mT or less than about 0.01 mT, the capillary condensation mechanism might be unsatisfactory. The cleaning cycle involves treating the contact openings O1 and O2 with ion bombardment performed using a gas including hydrogen ($H_2$), argon, helium, nitrogen ($N_2$), the like, or combinations thereof. The ion bombardment is advantageous for forming the interfacial layers 241 and 242 on the sidewalls of the contact openings O1 and O2 as discussed previously. In some embodiments, the deposition cycle and/or the cleaning cycle are performed at a temperature in a range from about 160° C. to about 250° C. If the temperature of the deposition cycle and/or the cleaning cycle is out of the range from about 160° C. to about 250° C., the bottom-up filling phenomenon might be degraded, thus leading to voids in the resulting conductive plugs 200 and 201.

In some embodiments where the precursor is ruthenium carbonyl, formation of the contact plugs 200 and 201 may be a single-step CVD process involving the capillary condensation mechanism as discussed above. The CVD process is performed at a temperature in a range from about 130° C. to about 250° C. If the temperature of the thermal CVD process is out of the range from about 130° C. to about 250° C., the bottom-up filling phenomenon might be degraded, thus leading to voids in the resulting conductive plugs 200 and 201. Ruthenium carbonyl is initially provided in a vapor phase at a partial pressure (e.g., from 0.01 mT to about 0.1 mT) below its saturation pressure. If the partial pressure of the ruthenium carbonyl is greater than about 0.1 mT or less than about 0.01 mT, the capillary condensation mechanism might be unsatisfactory.

Ruthenium-containing precursors as discussed above are not only suitable for implementing the capillary condensation mechanism, but also have inherent deposition selectivity between metal and oxide if the deposition process is performed at a temperature lower than about 250° C., as discussed below.

Figure 27:
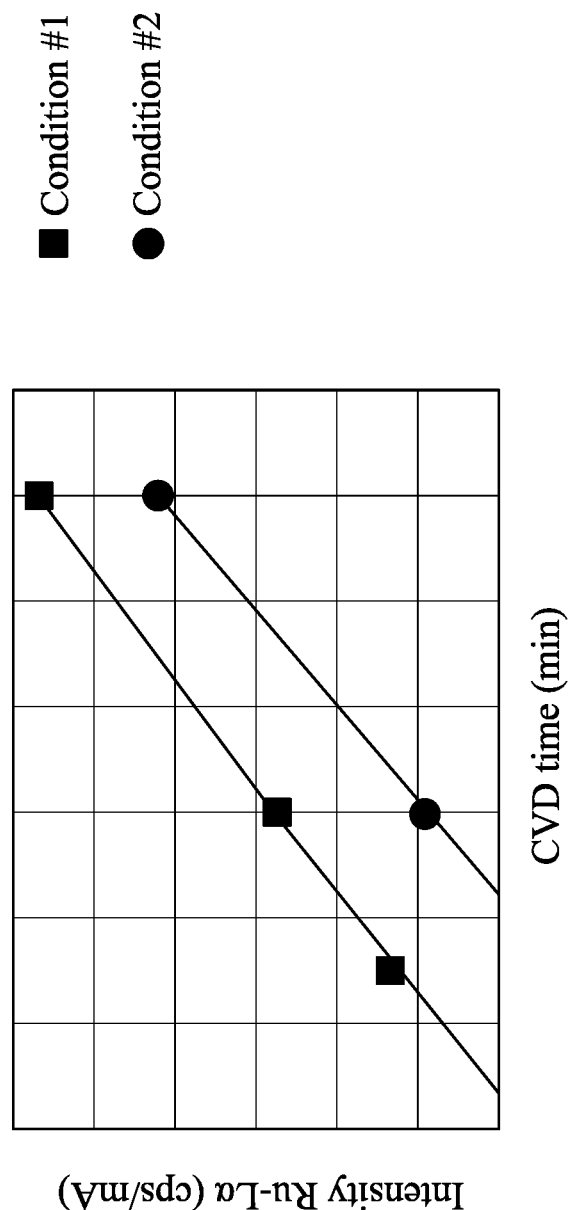
FIG. 27 illustrates experimental results of depositing ruthenium on various materials using a CVD process according to some embodiments of the present disclosure.

FIG. 27 illustrates experimental results of depositing ruthenium on various materials using a CVD process performed at a temperature ranging from about 195° C. to about 205° C. with ruthenium tricarbonyl as a precursor. FIG. 27 is a chart showing the thickness of the ruthenium layer as a function of time, wherein the thickness of the ruthenium layer is measured using X-ray fluorescence (XRF) and expressed as XRF intensity. In Condition #1, the CVD process is carried out to deposit ruthenium on platinum. In Condition #2, the CVD process is carried out to deposit ruthenium on silicon oxide. When the CVD process using ruthenium tricarbonyl as a precursor is performed at a temperature ranging from about 195° C. to about 205° C., the thickness of the ruthenium layer deposited on platinum is greater than that deposited on silicon oxide (comparing Condition #1 with Condition #2), which means that ruthenium tricarbonyl has deposition selectivity between metal and oxide if the deposition temperature is at a temperature in a range from about 195° C. to about 205° C.

Figure 28:
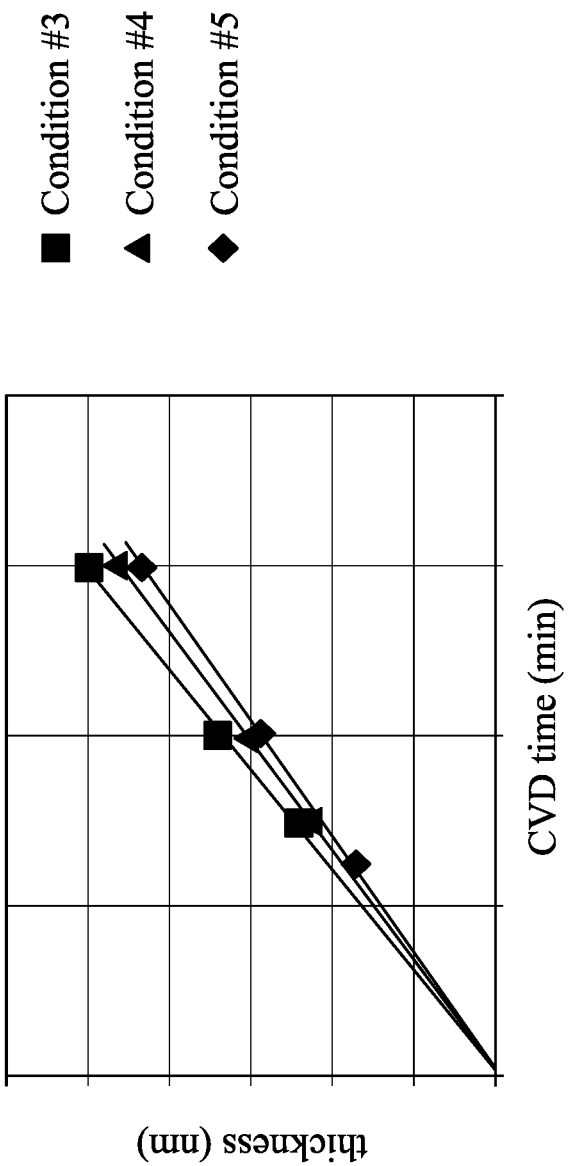
FIG. 28 illustrates experimental results of depositing ruthenium on various materials using a CVD process according to some embodiments of the present disclosure.

FIG. 28 illustrates experimental results of depositing ruthenium on various materials using a CVD process performed at a temperature ranging from about 250° C. to about 260° C. with ruthenium tricarbonyl as a precursor. FIG. 28 is a chart showing the thickness of the ruthenium layer as a function of time, wherein the thickness of the ruthenium layer is measured using scanning electron microscope (SEM). In Condition #3, the CVD process is carried out to deposit ruthenium on silicon oxide. In Condition #4, the CVD process is carried out to deposit ruthenium on ruthenium. In Condition #5, the CVD process is performed to deposit ruthenium on platinum. When the CVD process using ruthenium tricarbonyl as a precursor is performed at a temperature in a range from about 250° C. to about 260° C., the thickness of the ruthenium layer deposited on silicon oxide is substantially the same as or slightly greater than that deposited on platinum and ruthenium (comparing Condition #3 with Conditions #4 and #5,), which means ruthenium tricarbonyl has unsatisfactory selectivity between metal and oxide if the deposition temperature is equal to or greater than about 250° C. Because of the experimental results from FIGS. 27 and 28, the deposition temperature of formation of the contact plugs 200 and 201 may be not higher than about 250° C., so that the contact plugs 200 and 201 can be selectively deposited on the respective alloy caps 215 and 216, which in turn will result in improved bottom-up deposition.

Figure 20A:
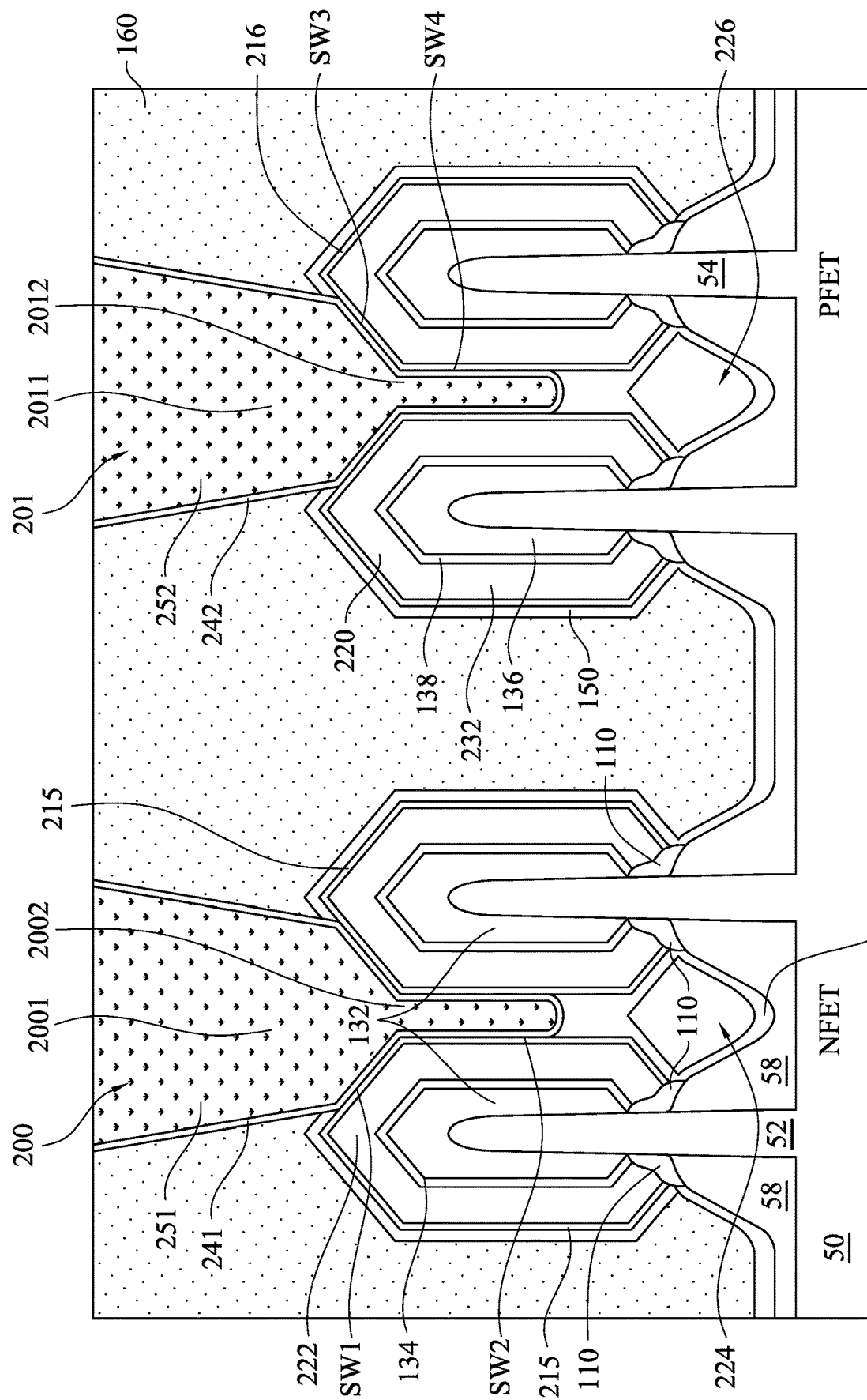
Figure 20B:
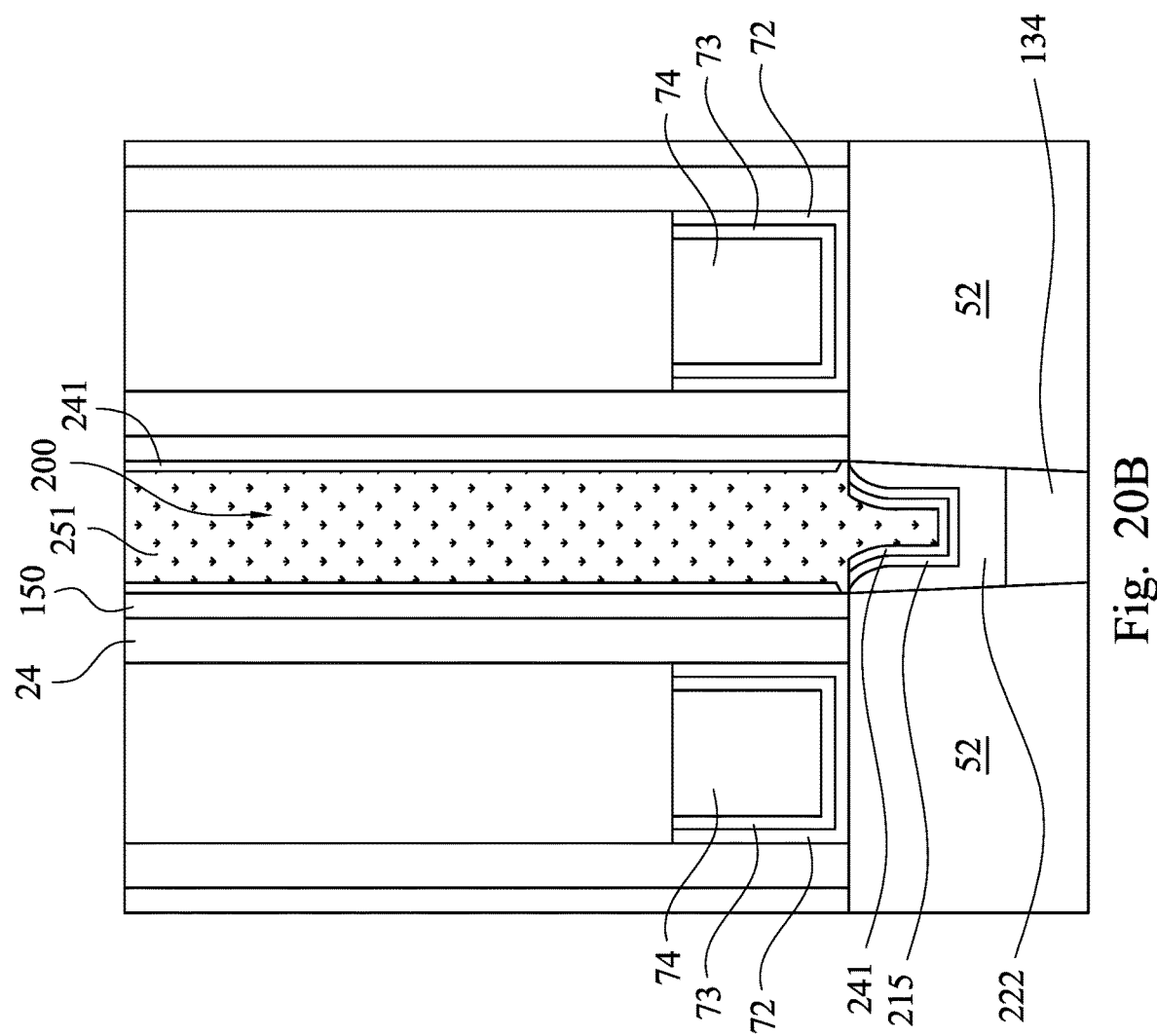

Returning to FIGS. 19A and 19B, after depositing the contact plugs 200 and 201, an optional anneal process is performed to reduce seams 261 and 262 in the noble metal structures 251 and 252, and an optional CMP process is carried out to remove excess materials of the noble metal structures 251, 252, and interfacial layers 241, 242 outside the contact openings O1 and O2. The resulting structure is shown in FIGS. 20A and 20B. In some embodiments, the anneal process is performed at a temperature of about 350° C. to about 500° C. for a duration of about 2 minutes to 45 minutes. If the temperature is greater than 500° C. and/or duration is greater than 45 minutes, it might lead to adverse impact on work functions of the metal gates (e.g., work functions of the work function adjustment layers 73 and the metal gate electrode layers 74). If the temperature is less than 350° C. and/or duration is greater than 2 minutes, the seams 261 and 262 might remain in the noble metal structures 251 and 252 after the anneal process.

As illustrated in FIG. 20A, the contact plug 200 is in contact with the up-slant sidewalls SW1 and the vertical sidewalls SW2 of the nitridated alloy caps 215. In some embodiments, the contact plug 200 includes a tapered portion 2001 tapering toward the substrate 50 and an extending portion 2002 extending downwardly from a bottom of the tapered portion 2001. The tapered portion 2001 and the extending portion 2002 are respectively in contact with the up-slant sidewall SW1 and the vertical sidewall SW2 of the nitridated alloy cap 215. The tapered opening O11 and the gap O12 are filled with the tapered portion 2001 and the extending portion 2002, respectively. Therefore, the tapered portion 2001 and the extending portion 2002 have contours the same as the tapered opening O11 and the gap O12, respectively. Specifically, the tapered portion 2001 has a width variation greater than a width variation of the extending portion 2002. For example, the width of the tapered portion 2001 decreases as a distance from the substrate 50 decreases, and the width of the extending portion 2002 remains substantially constant as the distance from the substrate 50 decreases.

Similarly, the contact plug 201 is in contact with the up-slant sidewalls SW3 and the vertical sidewalls SW4 of the nitridated alloy caps 216. In some embodiments, the contact plug 201 includes a tapered portion 2011 tapering toward the substrate 50 and an extending portion 2012 extending downwardly from a bottom of the tapered portion 2011. The tapered portion 2011 and the extending portion 2012 are respectively in contact with the up-slant sidewall SW3 and the vertical sidewall SW4 of the nitridated alloy cap 216. The tapered opening O21 and the gap O22 are filled with the tapered portion 2011 and the extending portion 2012, respectively. Therefore, the tapered portion 2011 and the extending portion 2012 have contours the same as the tapered opening O21 and the gap O22, respectively.

Figure 21A:
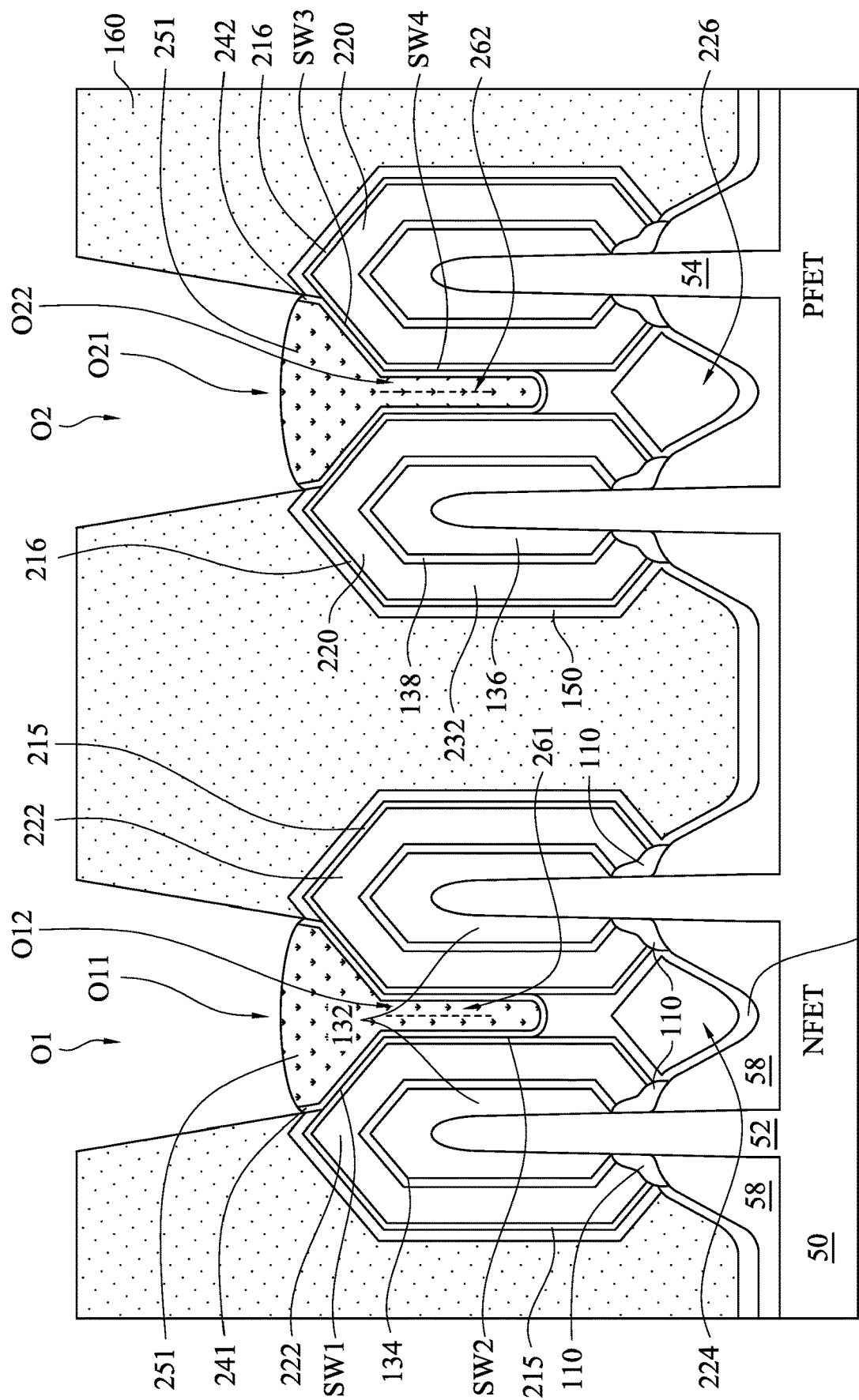
FIGS. 21A, 22A and 23A are exemplary cross-sectional views corresponding to the line A-A illustrated in FIG. 16 at various stages of forming contact plugs according to some embodiments of the present disclosure.
Figure 21B:
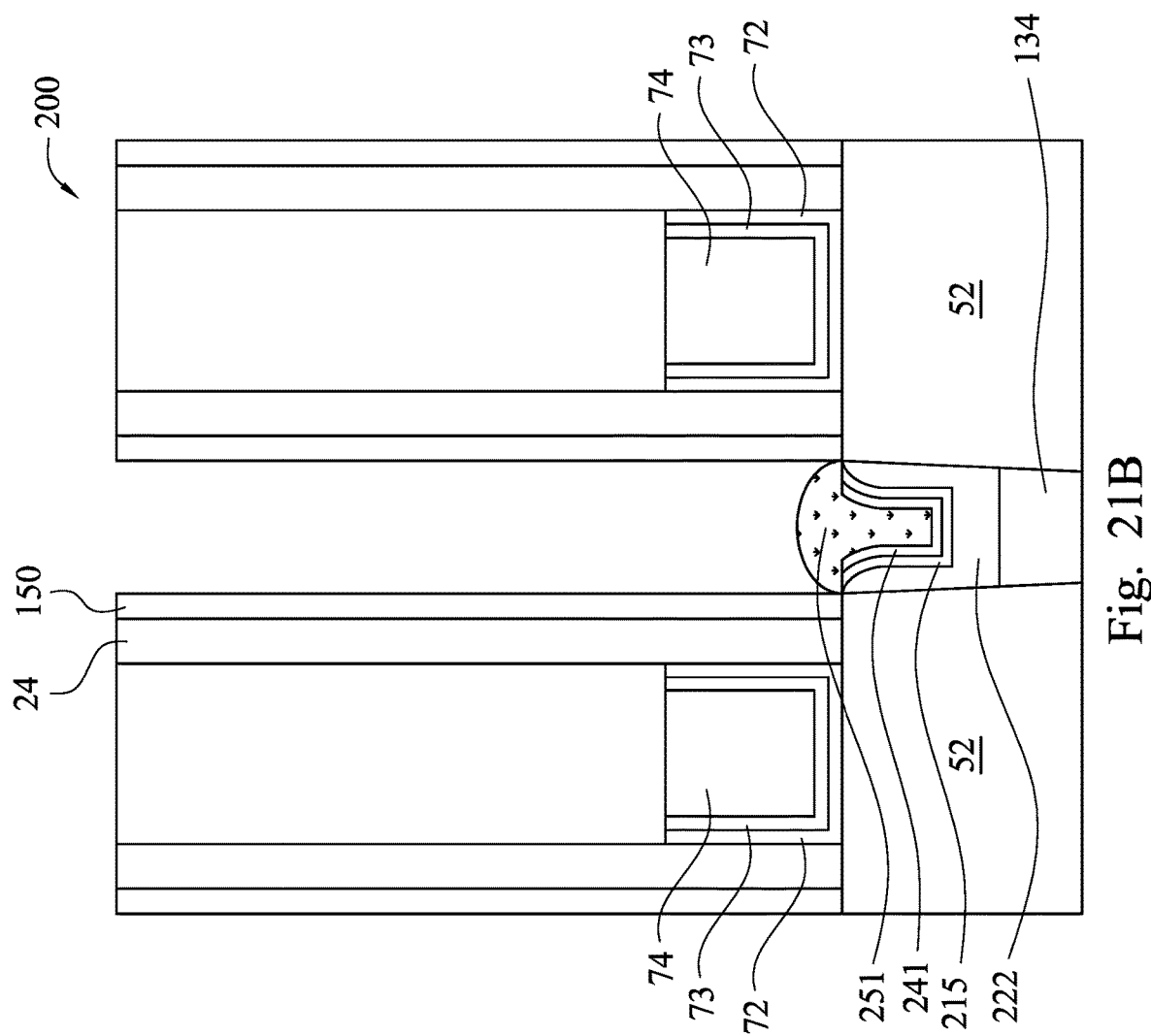
FIGS. 21B, 22B and 23B are exemplary cross-sectional views corresponding to the line B-B illustrated in FIG. 16 at various stages of forming contact plugs according to some embodiments of the present disclosure.

FIGS. 21A-23B are exemplary cross-sectional views at various stages of forming contact plugs according to some embodiments of the present disclosure. In FIGS. 21A-23B, the "A" figures (e.g., FIG. 21A) illustrate a cross-sectional view along X direction corresponding to the line A-A illustrated in FIG. 16, and the "B" figures (e.g., FIG. 21B) illustrate a cross-sectional view along the Y direction corresponding to the line B-B illustrated in FIG. 16. FIGS. 21A-23B shows substantially the same structures as FIGS. 17A-20B, except for the contact plugs. As illustrated in FIGS. 21A and 21B, the noble metal structures 251 and 252 are respectively deposited in lower parts of the contact openings O1 and O2, and upper parts of the contact openings O1 and O2 are free from the noble metal structures 251 and 252 and remain unfilled.

Figure 22A:
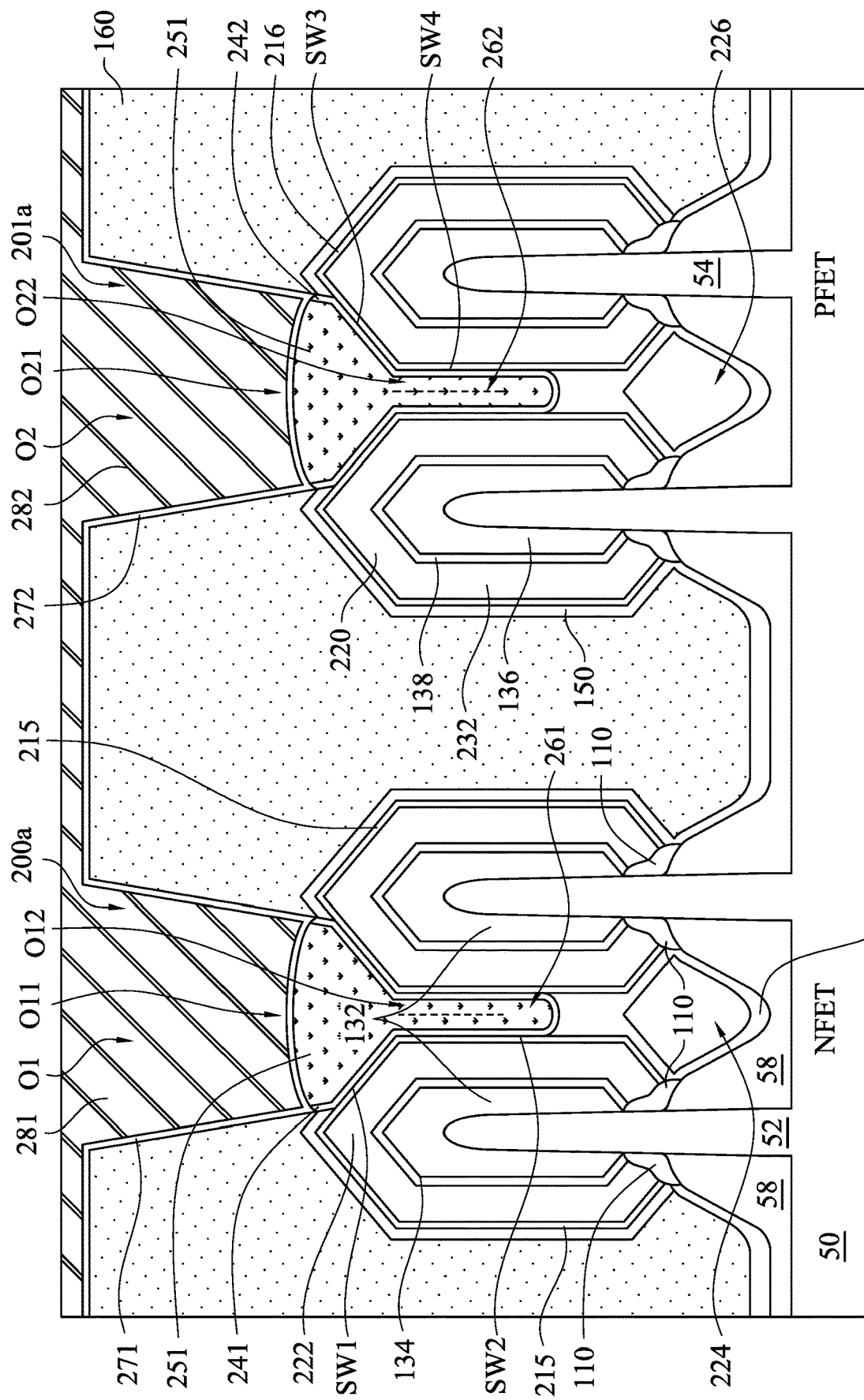
Figure 22B:
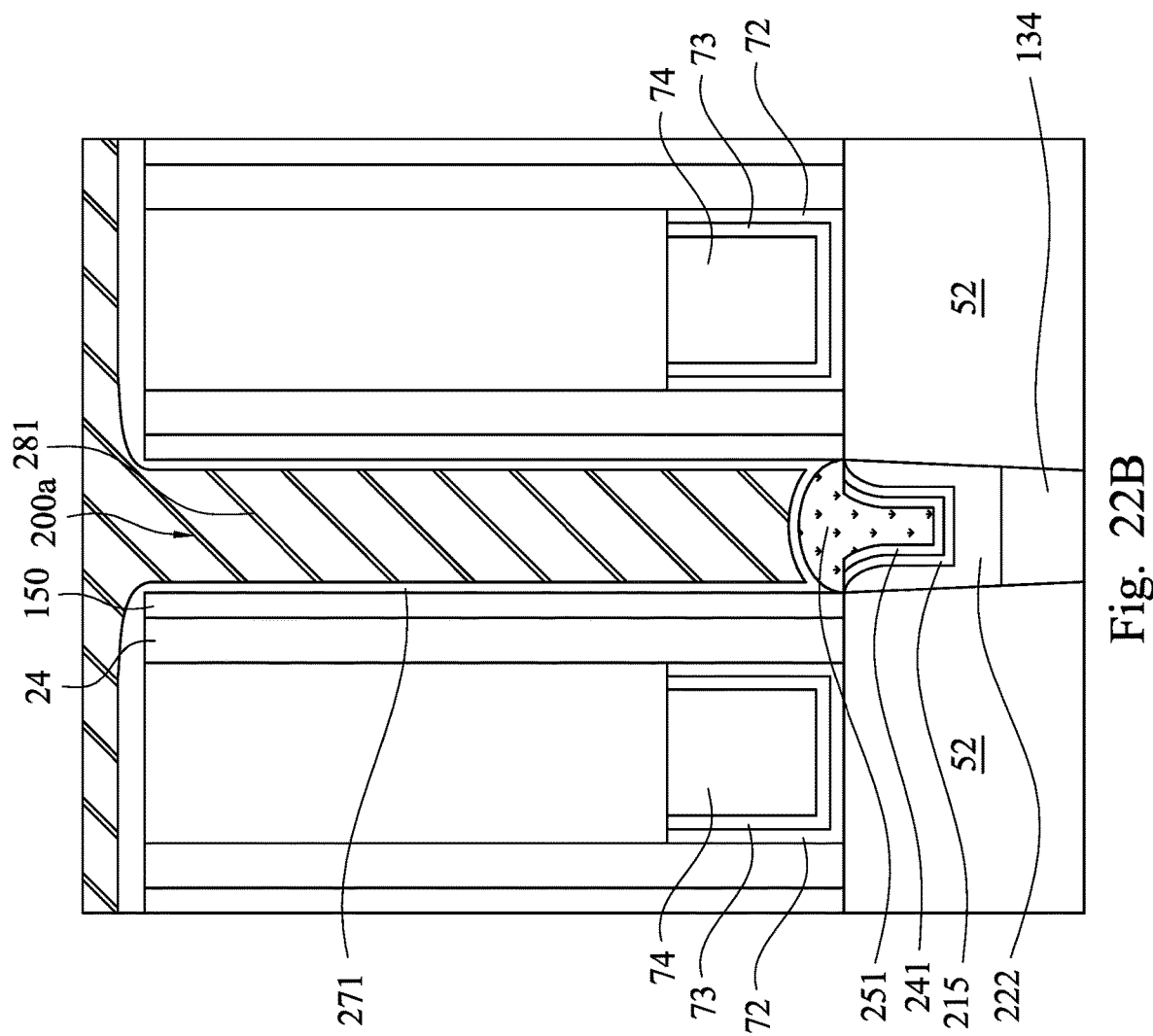

Afterwards, seed layers 271 and 272 are respectively formed in the upper parts of the contact openings O1 and O2 and on the noble metal structures 251 and 252, followed by depositing conductive structures, such as metal structures 281 and 282, on the respective seed layers 271 and 272 to form contact plugs 200a and 201a, as illustrated in FIGS. 22A and 22B. In some embodiments, the seed layers 271 and 272 are different portions of a blanket seed layer conformally deposited on the substrate 50, and the metal structures 281 and 282 are different portion of a metal layer deposited on the blanket seed layer. Thereafter, an optional anneal process can be performed to reduce the seams 261 and 262 in the noble metal structures 251 and 252, and a CMP is carried out to remove excess materials of the metal structures 281, 282, and seed layers 271, 272 outside the contact openings O1, O2. The resulting structure is shown in FIGS. 23A and 23B.

Figure 23A:
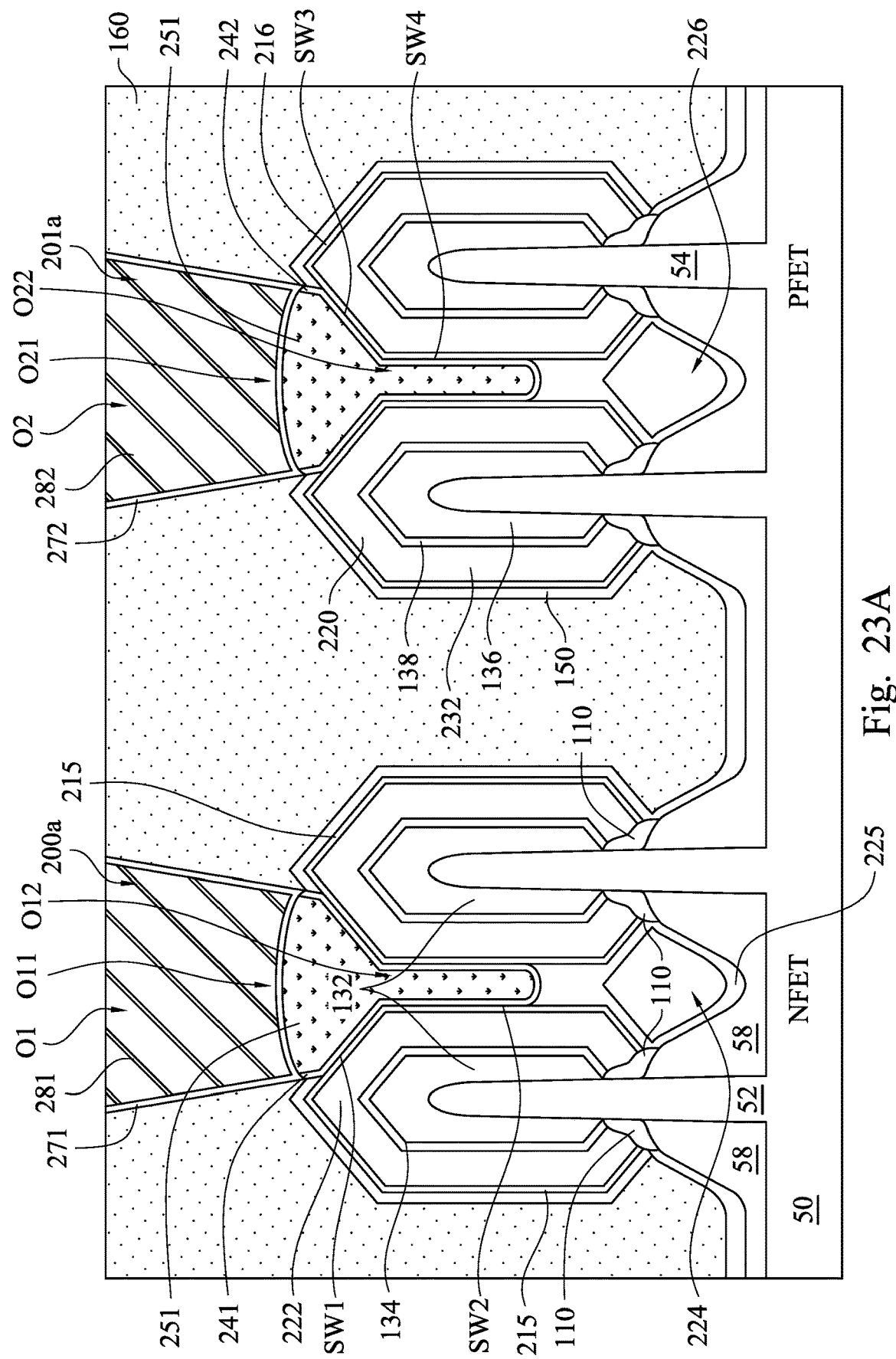
Figure 23B:
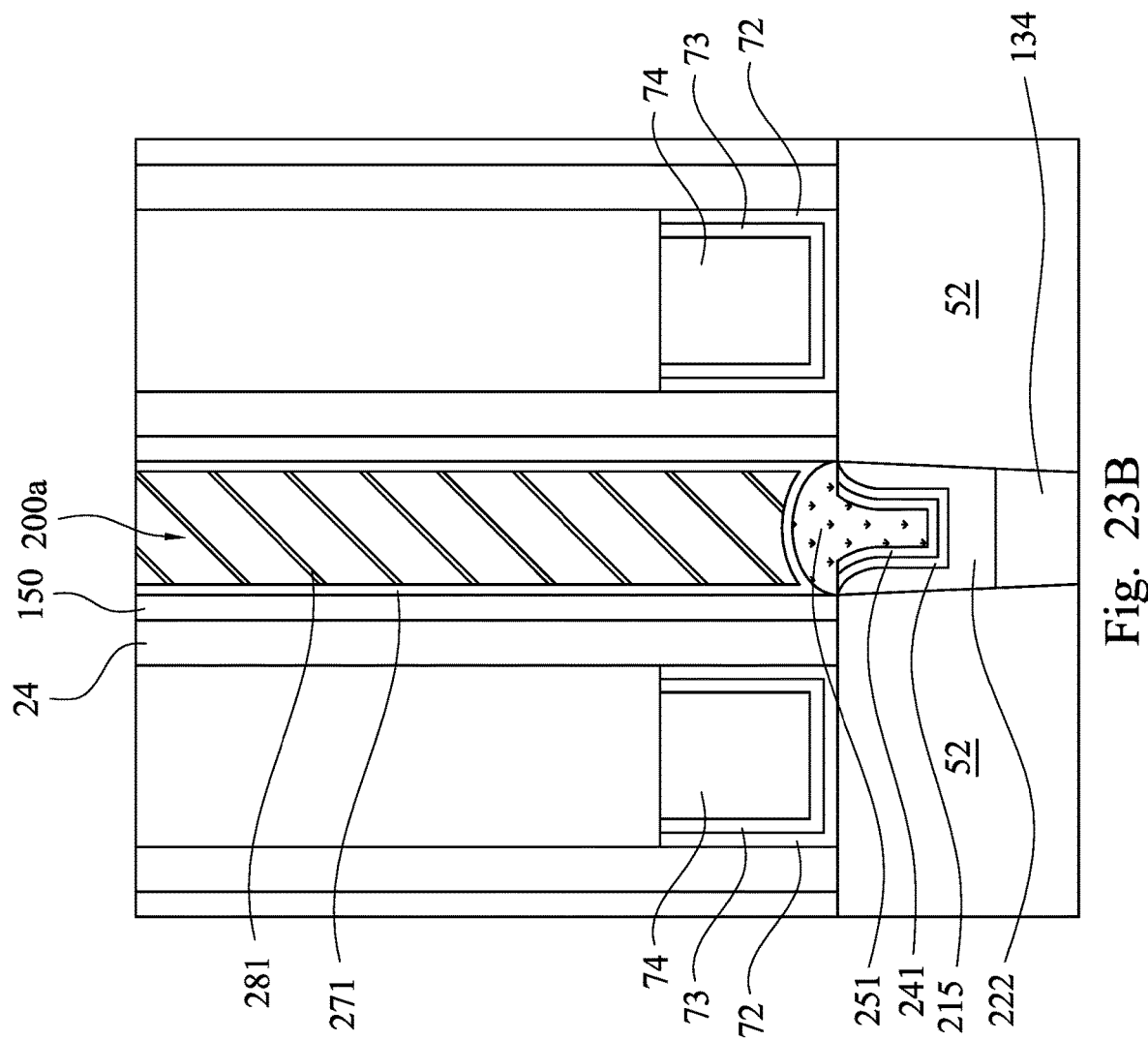

As illustrated in FIG. 23A, the seed layers 271 and 272 are conformally deposited in the upper parts of the tapered openings O11 and O21 and thus have a substantially U-shaped profile. Remaining upper parts of the tapered openings O11 and O21 are filled with the respective metal structures 281 and 282. Therefore, the metal structures 281 and 282 have tapered profile corresponding to the tapered openings O11 and O21, and can be equivalently referred to as tapered portions of the contact plugs 200a and 201a.

Materials of the seed layers 271, 272 and the metal structures 281, 282 are selected such that the metal structures 281 and 282 are deposited at a faster deposition rate than that of the capillary condensation CVD for depositing the noble metal structures 251 and 252. In this way, the contact plugs 200a and 201a can be formed in a shortened duration. In some embodiments, the seed layers 271 and 272 are made of TiN, TaN, the like, or combinations thereof, and the metal structures 281 and 282 made of, for example, Co, W, Ti, Ta, Cu, Rh, Ir, Al and/or Ni, different from the noble metal structures 251 and 252. These materials of seed layers 271 and 272 not only result in improved deposition rate of depositing the metal structures 281 and 282, but also act as diffusion barriers to suppress out-diffusion of metals of the metal structures 281 and 282 into the second ILD layer 160. As a result, the seed layers 217 and 272 can be equivalently referred to as diffusion barrier layers in some embodiments.

As shown in FIG. 23A, the diffusion barrier layer 271 extends in the contact opening O1 and terminates prior to reaching the alloy cap 215, and diffusion barrier layer 272 extends in the contact opening O2 and terminates prior to reaching the alloy cap 216. Stated differently, the diffusion barrier layer 271 over the noble metal structure 251 is separated from the alloy cap 215, and the diffusion barrier layer 272 over the noble metal structure 252 is separated from the alloy cap 216. As a result, the diffusion barrier layer 271 does not extend into the narrow gap defined by the vertical sidewalls SW2 of the nitridated alloy caps 215, and the diffusion barrier layer 272 does not extend into the narrow gap defined by the vertical sidewalls SW4 of the nitridated alloy caps 216.

Figure 24A:
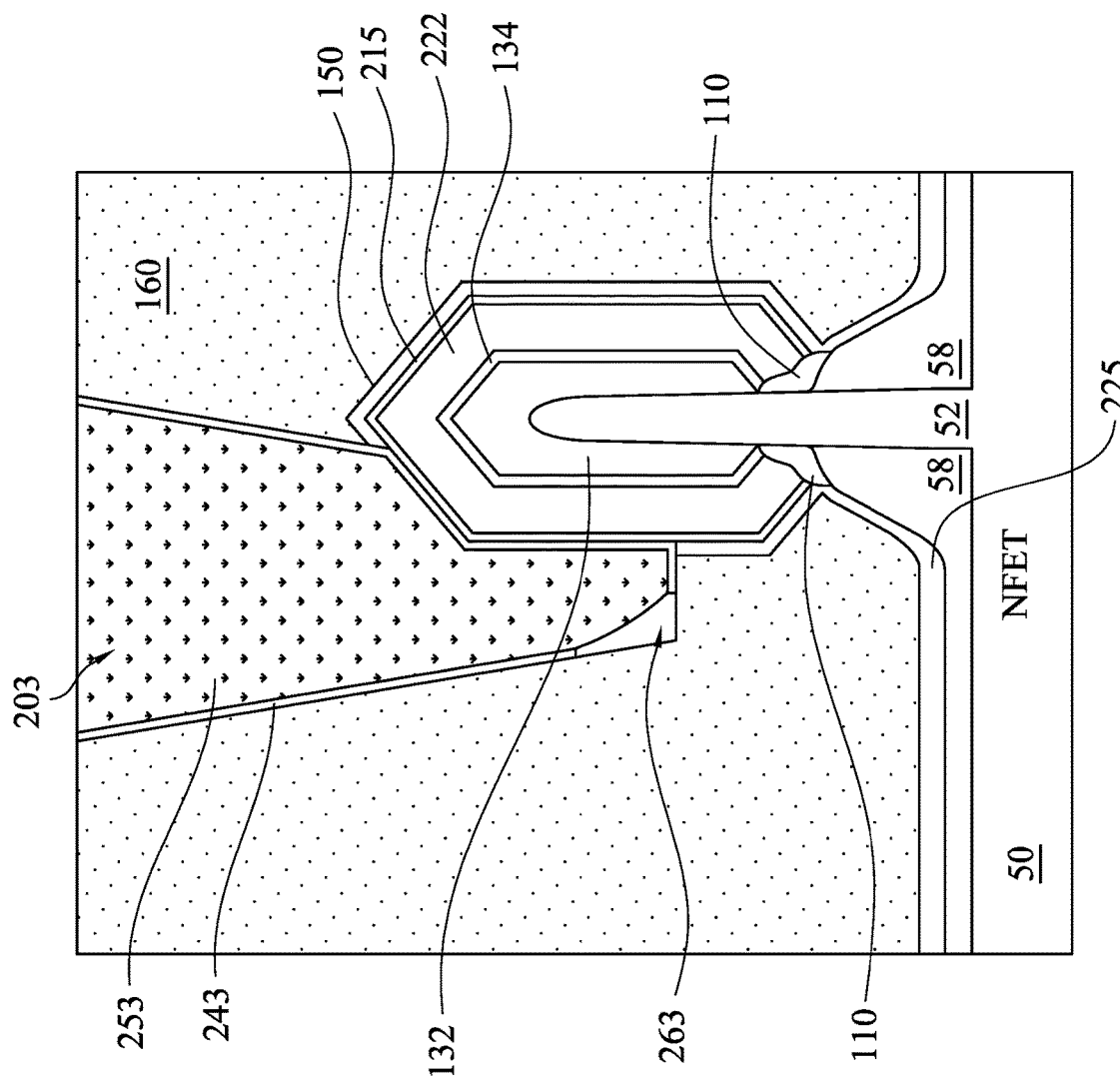
FIG. 24A is an exemplary cross-section view corresponding to the line A-A in FIG. 16 of a semiconductor device according to some embodiments of the present disclosure.
Figure 24B:
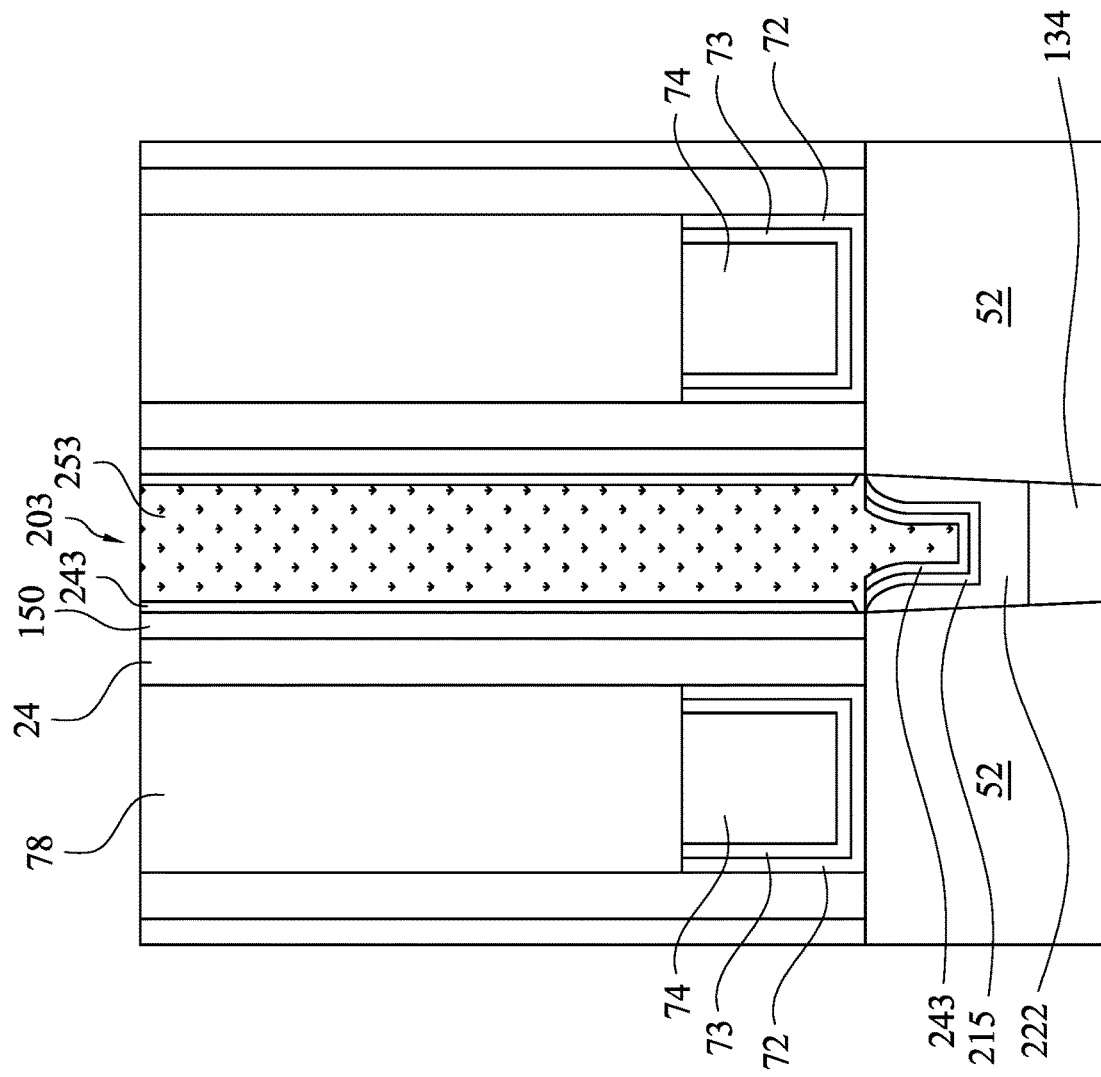
FIG. 24B is an exemplary cross-section view corresponding to the line B-B in FIG. 16 of a semiconductor device according to some embodiments of the present disclosure.

FIGS. 24A and 24B are exemplary cross-sectional views of a semiconductor device according to some embodiments of the present disclosure. FIG. 24A illustrates a cross-sectional view along X direction corresponding to the line A-A illustrated in FIG. 16, and FIG. 24B illustrates a cross-sectional view along the Y direction corresponding to the line B-B illustrated in FIG. 16. FIGS. 24A-24B show substantially the same structures as FIGS. 20A-20B, except there is a contact plug 203 landing on a single alloy cap 215. In some embodiments, the contact plug 203 includes an interfacial layer 243 and a noble metal structure 253 on the interfacial layer 243, which are substantially the same as the interfacial layer 241 and the noble metal structure 251, respectively, as discussed previously. Moreover, a void 263 is formed between the contact plug 203 and the second ILD layer 160. This is due to that the capillary condensation CVD process exhibits lower nucleation on oxide of the second ILD layer 160 than on metal of the alloy cap 215.

Figure 25:
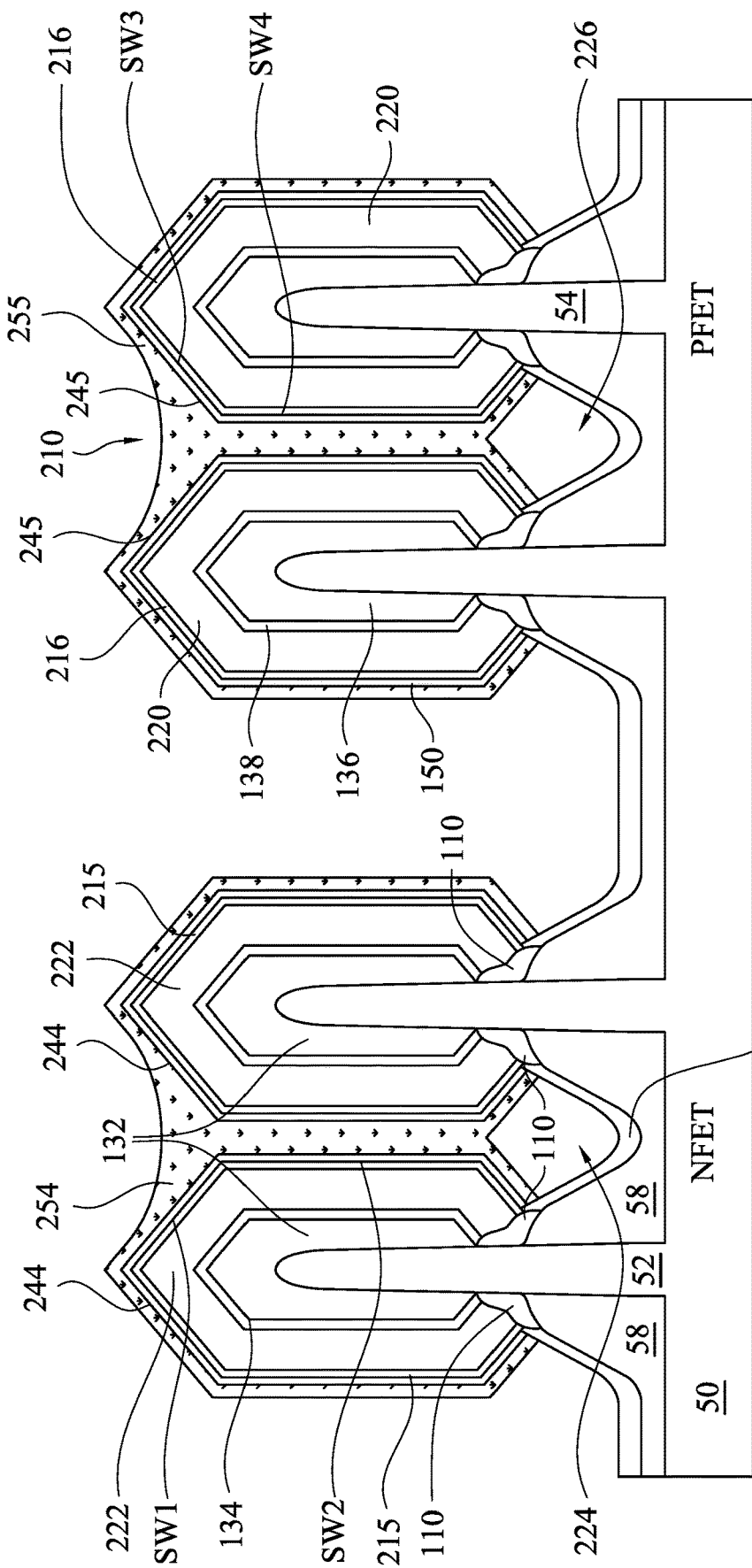
FIGS. 25 and 26 are exemplary cross-sectional views corresponding to the line A-A illustrated in FIG. 16 at various stages of forming contact plugs according to some embodiments of the present disclosure.
Figure 26:
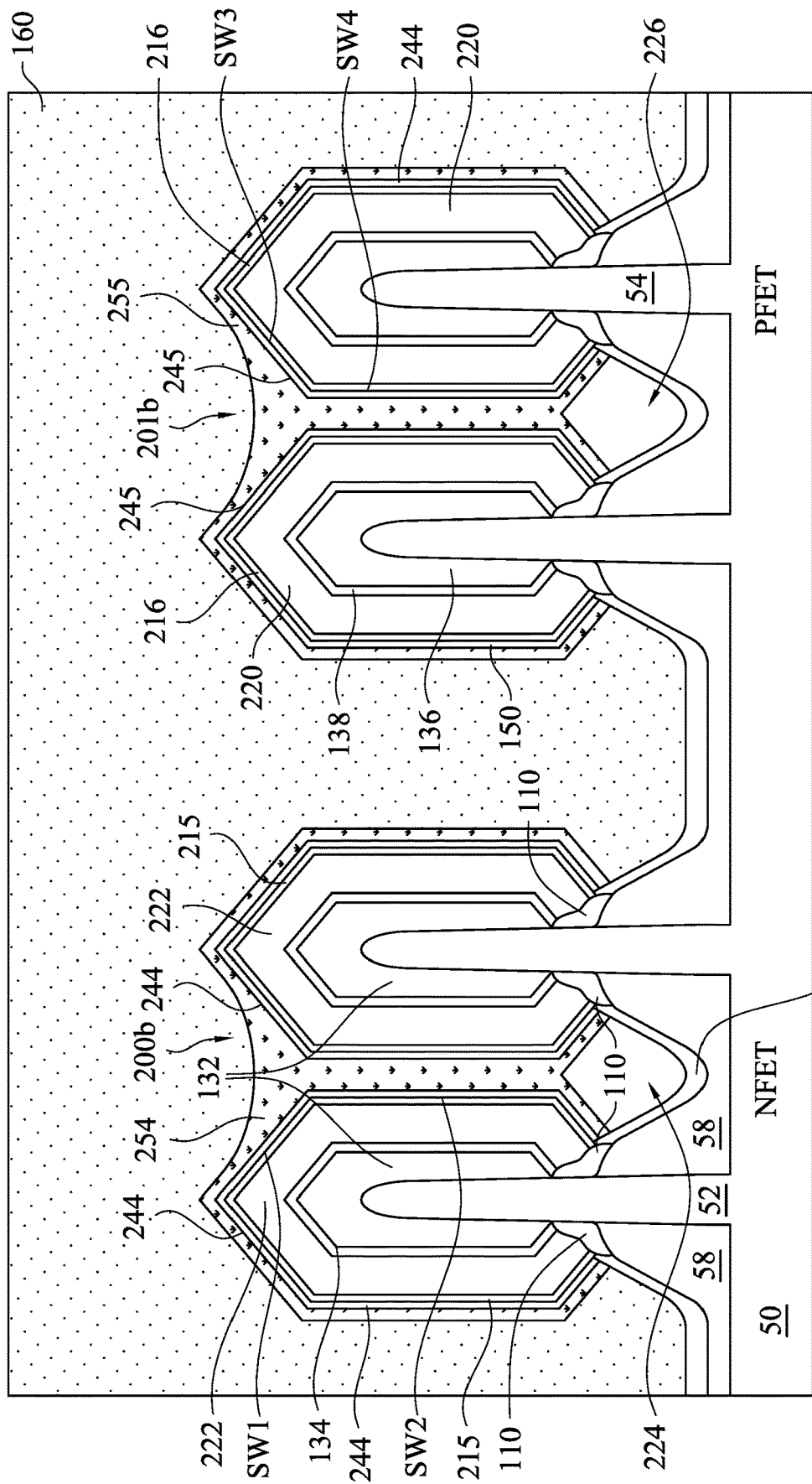

FIGS. 25 and 26 are exemplary cross-sectional views at various stages of forming contact plugs according to some embodiments of the present disclosure. FIG. 25 shows substantially the same structure as FIG. 15, except for the interfacial layers 244 and 245 formed on the respective alloy caps 215 and 216, and noble metal structures 254 and 255 formed on the respective interfacial layers 244 and 245.

As illustrated in FIG. 25, the interfacial layers 244 respectively wrap around the separated alloy caps 215 on the neighboring fin structures 52, and a noble metal structure 254 wrap around the interfacial layers 244. The interfacial layers 244 and noble metal structure 254 are substantially the same as the interfacial layer 241 and the noble metal structure 251 formed using the capillary condensation CVD, as discussed previously. Similarly, interfacial layers 245 respectively wrap around the separated alloy caps 216 on the neighboring fin structures 54, and a noble metal structure 255 wraps around the interfacial layers 245. The interfacial layers 245 and noble metal structure 255 are substantially the same as the interfacial layer 242 and the noble metal structure 252 formed using the capillary condensation CVD, as discussed previously.

Afterwards, the second ILD layer 160 is formed over the noble metal structures 254 and 255, as illustrated in FIG. 26. In some embodiments, the noble metal structure 254 and the interfacial layers 244 in the noble metal structure 254 can in combination serve as a contact plug 200b for the neighboring semiconductor fins 52, and in other embodiments, an additional metal structure is formed in the ILD layer 160 and on the noble metal structure 254 to complete formation of the contact plug 200b for the semiconductor fins 52. Similarly, in some embodiments, the noble metal structure 255 and the interfacial layers 245 in the noble metal structure 255 can in combination serve as a contact plug 201b for the neighboring semiconductor fins 54, and in other embodiments, an additional metal structure is formed in the ILD layer 160 and on the noble metal structure 255 to complete formation of the contact plug 201b.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the reduced source/drain contact resistance and hence improved device performance is achieved by forming a metal in the narrow gap between alloy layers (e.g., silicide layers) on neighboring semiconductor fins. Another advantage is that a bottom-up deposition can be achieved to fill the narrow gap between the alloy layers by using a capillary condensation CVD process. Another advantage is that enhanced bottom-up deposition and hence reduced volume of seams can be achieved by using an inhibition gas to inhibit metal nucleation on dielectric materials during the capillary condensation CVD. Another advantage is that the out-diffusion of the metal of the contact plug can be suppressed by the nitridated silicide cap. Another advantage is that reduced metal diffusion and hence omission of diffusion barrier metal can be achieved by using noble metal to form the contact plug.

In some embodiments, a semiconductor device comprises a first semiconductor fin, a first epitaxial layer, a first alloy cap and a contact plug. The first semiconductor fin is on a substrate. The first epitaxial layer is on the first semiconductor fin. The first alloy cap is over the first epitaxial layer. The first alloy cap is made of one or more Group IV elements and one or more metal elements, and the first alloy cap comprises a first sidewall and a second sidewall extending downwardly from a bottom of the first sidewall along a direction non-parallel to the first sidewall. The contact plug is in contact with the first and second sidewalls of the first alloy cap.

In some embodiments, a semiconductor device comprises a first semiconductor fin, a first epitaxial layer, a first alloy cap and a contact plug. The first semiconductor fin is on a substrate. The first epitaxial layer is on the first semiconductor fin. The first alloy cap is over the first epitaxial layer. The first alloy cap is made of one or more Group IV elements and one or more metal elements. The contact plug comprises an interfacial layer in contact with the first alloy cap, and a noble metal structure in contact with the interfacial layer, wherein the interfacial layer comprises the one or more Group IV elements and a noble metal element of the noble metal structure.

In some embodiments, a method for forming a semiconductor device comprises forming an epitaxial layer on a semiconductor fin, forming an alloy layer on the epitaxial layer by reacting the epitaxial layer with a metal, and forming a first metal structure on the alloy layer using a deposition process. The deposition process comprises providing a precursor in a vapor phase and keeping a partial pressure of the precursor below a saturation pressure of the precursor such that the precursor condenses as a liquid on the alloy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first semiconductor fin and a second semiconductor fin extending from a substrate;
    a first epitaxial layer wrapping around the first semiconductor fin;
    a second epitaxial layer wrapping around the second semiconductor fin; and
    a contact plug over the first epitaxial layer and the second epitaxial layer, the contact plug comprising a first interfacial layer over the first epitaxial layer and a second interfacial layer over the second epitaxial layer, the first and second interfacial layers comprising a noble metal element and a Group IV element, wherein the first interfacial layer is spaced apart from the first epitaxial layer at least by a metal silicide formed of a different composition than the first interfacial layer.

2. The device of claim 1, wherein the noble metal element is ruthenium.

3. The device of claim 1, wherein the contact plug comprises a lower portion and an upper portion over the lower portion, wherein the upper portion has a width variation greater than a width variation of the lower portion.

4. The device of claim 3, wherein sidewalls of the lower portion are more vertical than sidewalls of the upper portion.

5. The device of claim 1, wherein a majority of the contact plug is the noble metal element.

6. The device of claim 1, further comprising:
    a first nitridated metal-containing layer between the first epitaxial layer and the first interfacial layer, wherein the first nitridated metal-containing layer covers a surface of the metal silicide.

7. The device of claim 6, wherein the first interfacial layer is in contact with the first nitridated metal-containing layer.

8. The device of claim 6, further comprising:
    a second nitridated metal-containing layer between the second epitaxial layer and the second interfacial layer.

9. The device of claim 8, wherein the second interfacial layer is in contact with the second nitridated metal-containing layer.

10. The device of claim 1, wherein the first interfacial layer and the second interfacial layer are formed of a single continuous layer.

11. The device of claim 1, further comprising:
a nitridated metal silicide spacing apart the first interfacial layer from the metal silicide.

12. A device comprising:
a first semiconductor fin and a second semiconductor fin next to the first semiconductor fin;
a first source/drain epitaxial region on the first semiconductor fin;
a second source/drain epitaxial region on the second semiconductor fin; and
a common source/drain contact shared by the first source/drain epitaxial region and the second source/drain epitaxial region, the common source/drain contact comprising a noble metal element and a Group IV element, wherein the common source/drain contact comprises an interfacial layer spaced apart from the first source/drain epitaxial region at least by a metal silicide formed of a different composition than the interfacial layer.

13. The device of claim 12, wherein the common source/drain contact comprises:
a first profile having a first sidewall and a second sidewall extending along a first direction;
a second profile having a third sidewall and a fourth sidewall, wherein the third sidewall extends upwards from the first sidewall along a second direction different than the first direction, and the fourth sidewall extends upwards from the second sidewall along a third direction different than the first direction; and
a third profile having a fifth sidewall and a sixth sidewall, wherein the fifth sidewall extends upwards from the third sidewall along a fourth direction different than the second direction, and the sixth sidewall extends upwards from the fourth sidewall along a fifth direction different than the third direction.

14. The device of claim 12, wherein the interfacial layer is formed of the noble metal element and the Group IV element, and the common source/drain contact further comprises a fill metal structure over the interfacial layer, wherein the fill metal structure is formed of the noble metal element and free of the Group IV element.

15. The device of claim 12, further comprising:
a nitridated alloy layer between the metal silicide and the common source/drain contact.

16. The device of claim 15, wherein the nitridated alloy layer has a first surface and a second surface opposite the first surface, wherein the first surface of the nitridated alloy layer is in direct contact with the interfacial layer, and the second surface of the nitridated alloy layer is in direct contact with the metal silicide.

17. A device comprising:
a semiconductor fin protruding from a substrate;
a source/drain epitaxial region over the semiconductor fin;
a silicide layer over the source/drain epitaxial region;
a nitridated silicide layer over the silicide layer;
an interlayer dielectric (ILD) layer over the nitridated silicide layer; and
a contact plug extending through the ILD layer to the nitridated silicide layer, the contact plug comprises a noble metal element and a Group IV element, wherein the contact plug comprises an interfacial layer interfacing the nitridated silicide layer and a metal structure over the interfacial layer, wherein the interfacial layer is formed of the noble metal element and the Group IV element, and the metal structure is free of the noble metal element and the Group IV element.

18. The device of claim 17, wherein the source/drain epitaxial region comprises a first epitaxial layer and a second epitaxial layer over the first epitaxial layer.

19. The device of claim 18, wherein the second epitaxial layer has a dopant concentration greater than a dopant concentration of the first epitaxial layer.

20. The device of claim 17, wherein the silicide layer and the nitridated silicide layer comprise the Group IV element.

* * * * *